(12) United States Patent
Nam et al.

(10) Patent No.: US 10,002,875 B2
(45) Date of Patent: Jun. 19, 2018

(54) SEMICONDUCTOR DEVICES WITH CHARGE FIXING LAYERS

(71) Applicants: Phil Ouk Nam, Suwon-si (KR); Hyung Joon Kim, Yongin-si (KR); Sung Gil Kim, Yongin-si (KR); Ji Hoon Choi, Seongnam-si (KR); Seulye Kim, Seoul (KR); Hong Suk Kim, Yongin-si (KR); Jae Young Ahn, Seongnam-si (KR)

(72) Inventors: Phil Ouk Nam, Suwon-si (KR); Hyung Joon Kim, Yongin-si (KR); Sung Gil Kim, Yongin-si (KR); Ji Hoon Choi, Seongnam-si (KR); Seulye Kim, Seoul (KR); Hong Suk Kim, Yongin-si (KR); Jae Young Ahn, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/466,111

(22) Filed: Mar. 22, 2017

(65) Prior Publication Data

US 2018/0053775 A1   Feb. 22, 2018

(30) Foreign Application Priority Data

Aug. 22, 2016   (KR) .......................... 10-2016-0106014

(51) Int. Cl.
| | |
|---|---|
| *H01L 29/49* | (2006.01) |
| *H01L 27/11556* | (2017.01) |
| *H01L 27/11582* | (2017.01) |
| *H01L 29/40* | (2006.01) |
| *H01L 29/06* | (2006.01) |

(52) U.S. Cl.
CPC .. *H01L 27/11556* (2013.01); *H01L 27/11582* (2013.01); *H01L 29/0653* (2013.01); *H01L 29/402* (2013.01); *H01L 29/408* (2013.01)

(58) Field of Classification Search
CPC . H01L 27/1156; H01L 29/0653; H01L 29/402
See application file for complete search history.

(56) References Cited

U.S. PATENT DOCUMENTS

| | | | |
|---|---|---|---|
| 8,283,719 B2 | 10/2012 | Huo et al. | |
| 9,263,542 B2 | 2/2016 | Liu et al. | |
| 2005/0059214 A1 | 3/2005 | Cheng et al. | |
| 2010/0213521 A1 | 8/2010 | Jeon et al. | |
| 2014/0346615 A1 | 11/2014 | Zhang et al. | |
| 2015/0129954 A1 | 5/2015 | Kim et al. | |
| 2015/0380418 A1 | 12/2015 | Zhang et al. | |
| 2015/0380431 A1 | 12/2015 | Kanamori et al. | |
| 2016/0049422 A1 | 2/2016 | Kim et al. | |
| 2016/0099250 A1 | 4/2016 | Rabkin et al. | |
| 2016/0148947 A1* | 5/2016 | Seo .................. | H01L 27/11582 257/324 |

* cited by examiner

*Primary Examiner* — Michael Shingleton
(74) *Attorney, Agent, or Firm* — Myers Bigel, P.A.

(57) ABSTRACT

A semiconductor device may include gate electrodes and interlayer insulating layers alternately stacked on a substrate, a channel layer penetrating the gate electrodes and the interlayer insulating layers, a gate dielectric layer between the gate electrodes and the channel layer, a filling insulation that fills at least a portion of an interior of the channel layer, a charge fixing layer between the channel layer and the filling insulation and including a high-k material and/or a metal, and a conductive pad connected to the channel layer and on the filling insulation. The conductive pad may be physically separated from the charge fixing layer.

20 Claims, 27 Drawing Sheets

"A"

"A"

"B"

SEMICONDUCTOR DEVICES WITH CHARGE FIXING LAYERS

CROSS-REFERENCE TO RELATED APPLICATION(S)

This application claims benefit of priority under 35 U.S.C. § 119 to Korean Patent Application No. 10-2016-0106014, filed on Aug. 22, 2016 in the Korean Intellectual Property Office, the contents of which are hereby incorporated herein by reference in their entirety.

BACKGROUND

Embodiments of the inventive concepts disclosed herein relate to semiconductor devices and, more particularly, to semiconductor devices with vertical transistor structures and methods of manufacturing the same.

In general, volumes of some electronic products have gradually been reduced, while still being required to process high capacity data. Thus, semiconductor devices used in such electronic products may have a high degree of integration. To increase the integration of semiconductor devices, some semiconductor devices may have three-dimensional transistor structures, for example, a vertical transistor structure, rather than a planar transistor structure.

SUMMARY

An aspect of the present inventive concept is to provide semiconductor devices having improved channel characteristics and methods of manufacturing the same.

According to some embodiments of the inventive concepts, semiconductor devices are provided. A semiconductor device may include gate electrodes and interlayer insulating layers alternately stacked on a substrate. The semiconductor device may include a channel layer penetrating the gate electrodes and the interlayer insulating layers. The semiconductor device may include a gate dielectric layer between the gate electrodes and the channel layer. The semiconductor device may include a filling insulation that fills at least a portion of an interior of the channel layer. The semiconductor device may include a charge fixing layer between the channel layer and the filling insulation and including a high-k material and/or a metal. The semiconductor device may include a conductive pad connected to the channel layer and on the filling insulation. The conductive pad may be physically separated from the charge fixing layer.

According to some embodiments of the inventive concepts, semiconductor devices are provided. A semiconductor device may include a stacked structure including conductive layers and interlayer insulating layers alternately stacked on a substrate, and having a hole penetrating through the stacked structure in a stacking direction. The semiconductor device may include a vertical structure in the hole. The vertical structure may sequentially include a gate dielectric layer, a channel layer and a charge fixing layer adjacent to the conductive layers. The semiconductor device may include a conductive pad on the vertical structure and connected to the channel layer. The charge fixing layer may include a material capable of allowing negative charges to be accumulated therein. The charge fixing layer may be physically separated from the conductive pad.

According to some embodiments of the inventive concepts, semiconductor devices are provided. A semiconductor device may include a plurality of gate electrodes and a plurality of interlayer insulating layers alternately stacked on a substrate. The semiconductor device may include a channel layer penetrating the plurality of gate electrodes and the plurality of interlayer insulating layers. The channel layer may include an exterior surface adjacent to the plurality of gate electrodes and an interior surface remote from the plurality of gate electrodes. The semiconductor device may include a charge fixing layer on the interior surface of the channel layer. The charge fixing layer may be configured to reduce an effective width of the channel layer during an operation of the semiconductor device to less than a physical width of the channel layer by accumulating negative charges. The semiconductor device may include a conductive pad connected to the channel layer. The conductive pad may be physically separated from the charge fixing layer.

BRIEF DESCRIPTION OF DRAWINGS

The above and other aspects, features and other advantages of the present disclosure will be more clearly understood from the following detailed description taken in conjunction with the accompanying drawings.

DETAILED DESCRIPTION

Figure 1:
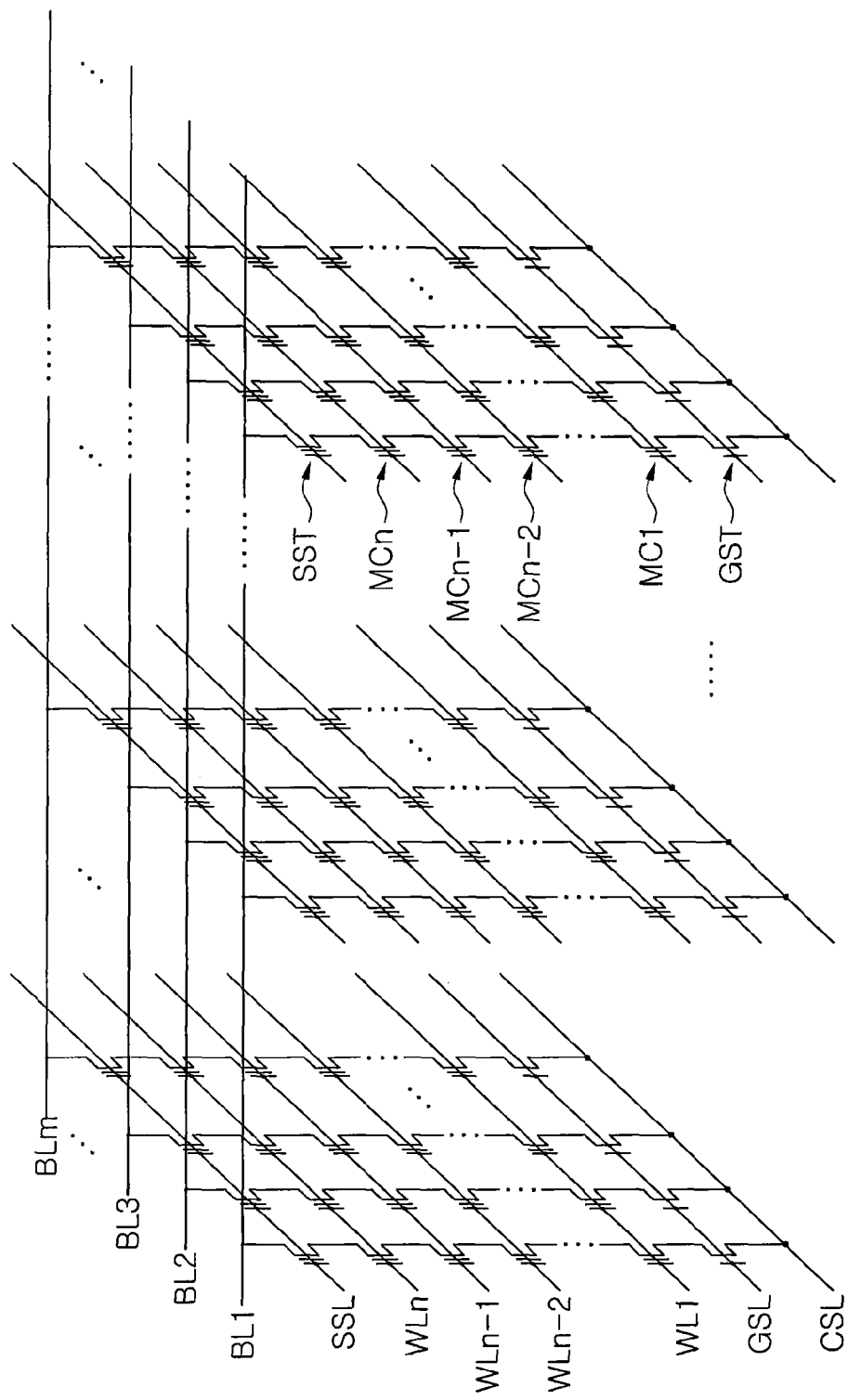
FIG. 1 is a schematic circuit diagram of a memory cell array of a semiconductor device according to some embodiments of the inventive concepts.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "connected to" or "on" another element, it can be directly connected to or on the other element or intervening elements may be present. In contrast, the term "directly" means that there are no intervening elements. Additionally, embodiments that are described in the detailed description may be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Embodiments of the present inventive concepts explained and illustrated herein may include their complementary counterparts. The same reference numerals or the same reference designators denote the same elements throughout the specification.

Figure 2:
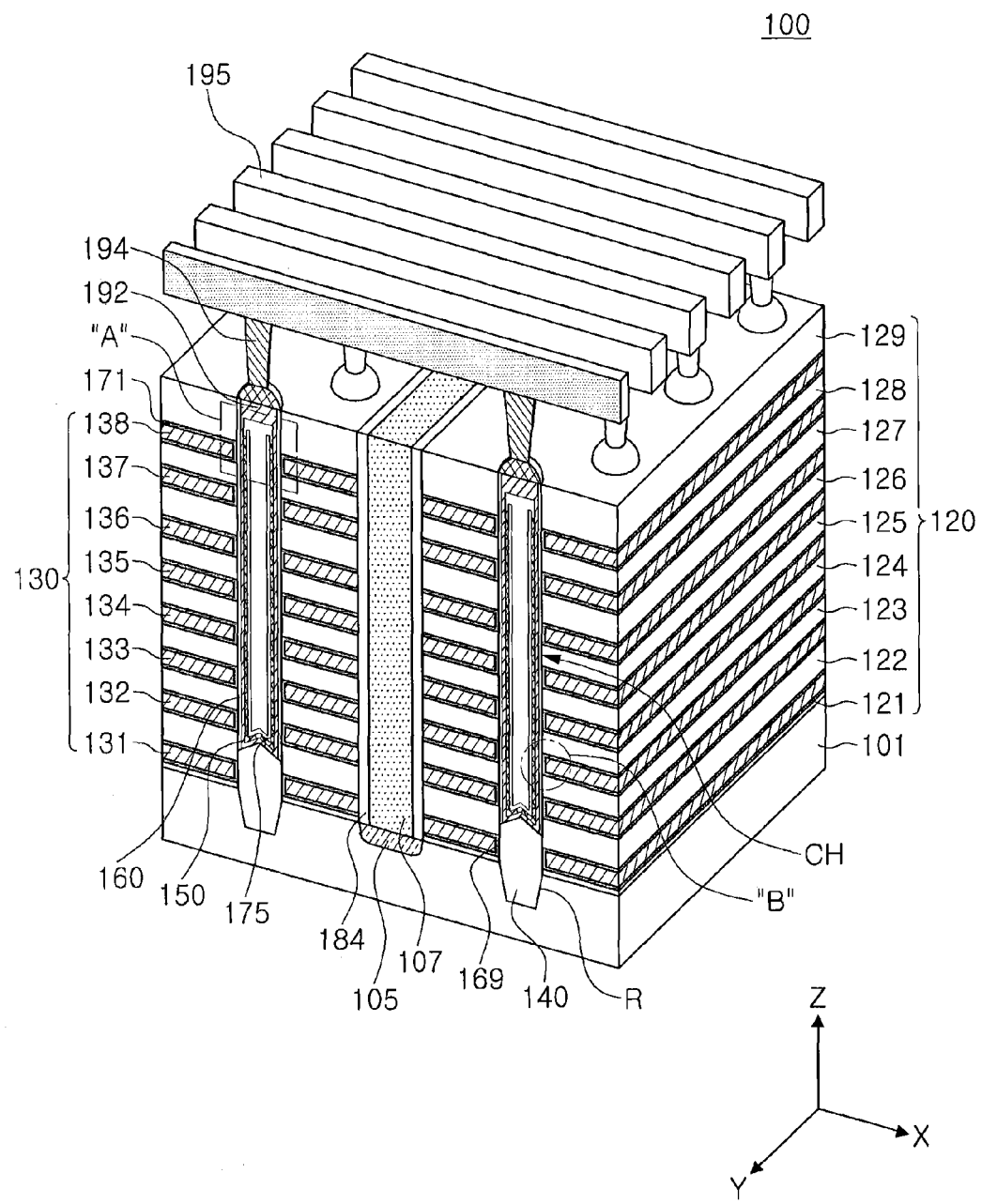
FIG. 2 is a schematic perspective view of a semiconductor device according to some embodiments of the inventive concepts.

FIG. 1 is an equivalent circuit diagram of a memory cell array of a semiconductor device according to some embodiments of the inventive concepts, which can be understood as the equivalent circuit diagram of a memory cell array having a three-dimensional structure, included in a semiconductor device 100 of FIG. 2.

Referring to FIG. 1, a memory cell array according to some embodiments of the inventive concepts may include a plurality of memory cell strings including n number of memory cell transistors MC1 to MCn connected to one another in series, and a ground select transistor GST and a string select transistor SST respectively connected to two ends of the memory cell transistors MC1 to MCn in series.

The n number of memory cell transistors MC1 to MCn connected to one another in series may be connected to word lines WL1 to WLn to select at least a portion of the memory cell transistors MC1 to MCn, respectively.

Gate terminals of the ground select transistors GST may be connected to a ground select line GSL, and source terminals thereof may be connected to a common source line CSL. Gate terminals of the string select transistors SST may be connected to a string select line SSL, and source terminals thereof may be connected to drain terminals of memory cell transistors MCn.

Although FIG. 1 illustrates a structure in which one ground select transistor GST and one string select transistor SST are respectively connected to the n number of memory cell transistors MC1 to MCn connected to one another in series, in some embodiments, a plurality of ground select transistors GST and/or a plurality of string select transistors SST may also be connected thereto.

Drain terminals of the string select transistors SST may be connected to bit lines BL1 to BLm. When a signal is applied to gate terminals of the string select transistors SST through the string select line SSL, the signal applied through the bit lines BL1 to BLm may be transferred to the n number of memory cell transistors MC1 to MCn connected to one another in series, and thus, a data reading operation or a data writing operation may be performed.

Figure 3:
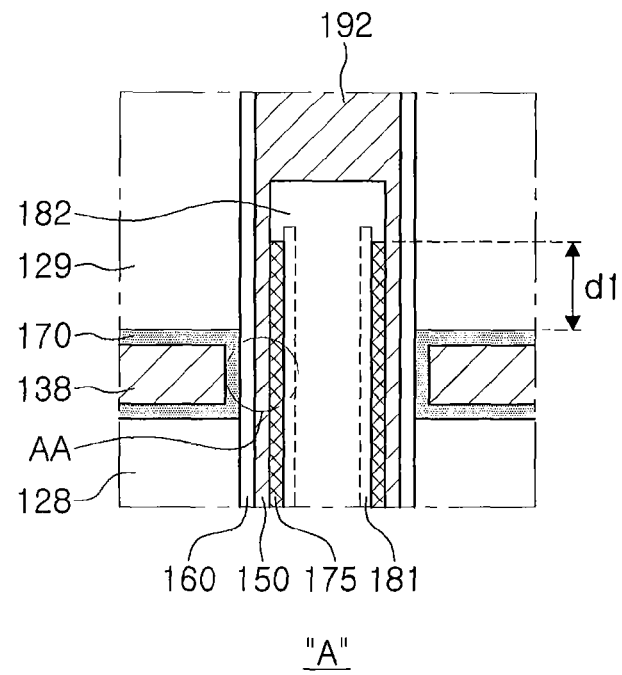
FIG. 3 is an enlarged cross-sectional view of region "A" of the semiconductor device illustrated in FIG. 2 according to some embodiments of the inventive concepts.
Figure 4:
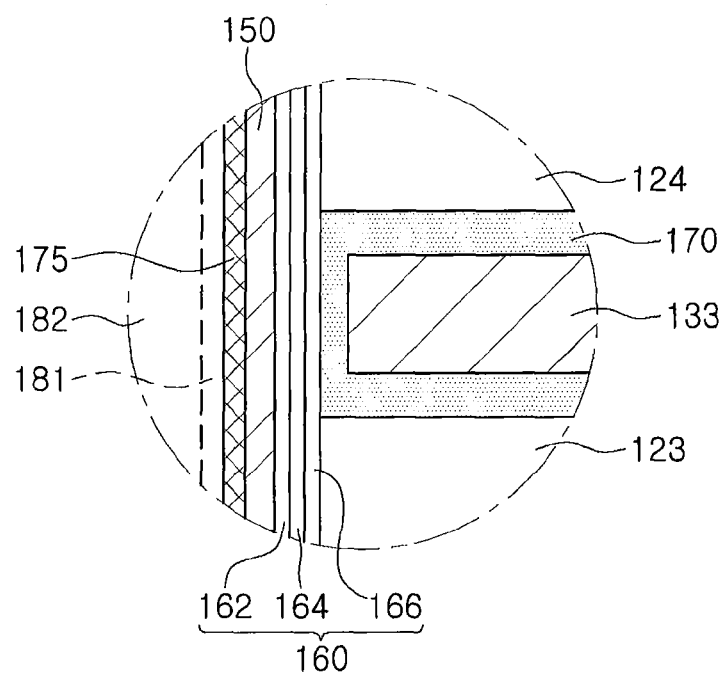
FIG. 4 is an enlarged cross-sectional view of region "B" of the semiconductor device illustrated in FIG. 2 according to some embodiments of the inventive concepts.
Figure 5:
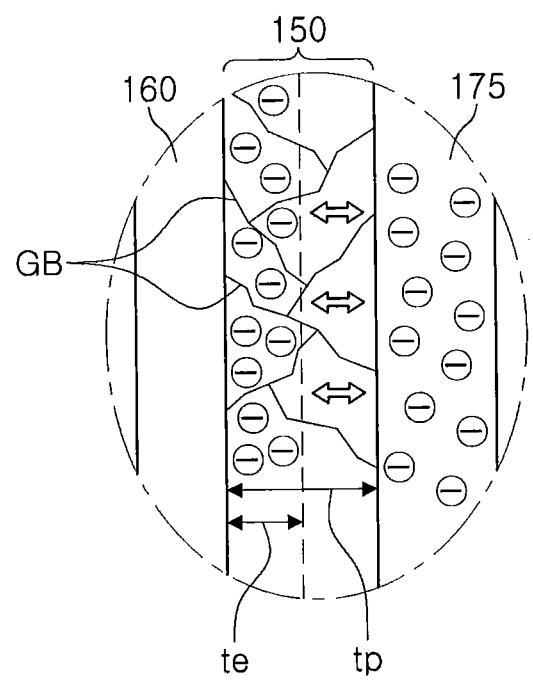
FIG. 5 is a schematic view illustrating a scale-down effect by a charge fixing layer in a region "AA" of the region "A" illustrated in FIG. 2 according to some embodiments of the inventive concepts.

FIG. 2 is a schematic perspective view illustrating memory cell arrays of a semiconductor device according to some embodiments of the inventive concepts. FIG. 3 is an enlarged cross-sectional view of region "A" of the semiconductor device illustrated in FIG. 2 according to some embodiments of the inventive concepts. FIG. 4 is an enlarged cross-sectional view of region "B" of the semiconductor device illustrated in FIG. 2 according to some embodiments of the inventive concepts. FIG. 5 is a schematic view illustrating a scale-down effect by a charge fixing layer in a region "AA" of the region "A" illustrated in FIG. 3 according to some embodiments of the inventive concepts.

Referring to FIG. 2, the semiconductor device 100 may include a substrate 101, and a stack structure including interlayer insulating layers 120 and gate electrodes 130 alternately stacked on the substrate 101. The stack structure may include channel holes CH formed in a vertical direction.

A vertical structure may fill the channel holes CH. The vertical structure may include a gate dielectric layer 160, a channel layer 150, and a charge fixing layer 175 disposed sequentially, adjacent to the gate electrodes 130.

In some embodiments, a surface of the channel layer 150 may be in contact with the gate dielectric layer 160, and an opposing surface of the channel layer 150 may be in contact with the charge fixing layer 175. The charge fixing layer 175 according to some embodiments may include a material capable of allowing negative charges to be accumulated therein, to thus allow for a reduction in an effective thickness of the channel layer 150. A description thereof will be described in detail with reference to FIG. 3.

In the semiconductor device 100 illustrated in FIG. 2, according to some embodiments, one channel layer 150 may configure one memory cell string. A plurality of memory cell strings may be arranged in columns and rows in an X direction and in a Y direction.

The substrate 101 may have an upper surface extended in X and Y directions. The substrate 101 may include a semiconductor material. For example, the semiconductor material may include a group IV semiconductor material, for example, silicon or silicon germanium, a group III-V compound semiconductor material, or a group II-VI compound semiconductor material. The substrate 101 may be provided as a bulk wafer or an epitaxial layer.

With reference to FIGS. 1 and 2, gate electrodes 131 to 138 (collectively referred to as gate electrodes 130) may be disposed to be spaced apart from each other, along a respective side of the channel layer 150, from the substrate 101 in a Z direction. The gate electrodes 130 may configure gates of the ground select transistor GST, the memory cell transistors MC1 to MCn, and the string select transistor SST, respectively. The gate electrodes 130 may extend to form the word lines WL1 to WLn.

Gate electrodes 132 to 136 of the memory cell transistors MC1 to MCn are illustrated as being five gate electrodes by way of example, but are not limited thereto. The number of gate electrodes 130 forming the memory cell transistors MC1 to MCn may be determined depending on a capacity of the semiconductor device 100. For example, in some embodiments, the number of gate electrodes 130 forming the memory cell transistors MC1 to MCn may be 30 or more.

The gate electrode 131 of the ground select transistor GST may extend in a Y direction to form the ground select line GSL. In order to obtain a function of the ground select transistor GST, a portion of the substrate 101 below the gate electrode 131 may be doped with a predetermined impurity. The gate electrodes 137 and 138 of the string select transistor SST may extend in a Y direction to form the string select line SSL. In addition, portions of the gate electrodes 130, for example, gate electrodes 130 adjacent to the gate electrode 131 of the ground select transistor GST or the gate electrodes 137 and 138 of the string select transistor SST may be dummy gate electrodes. For example, in some embodiments, the gate electrode 132 adjacent to the gate electrode 131 of the ground select transistor GST may be a dummy gate electrode.

The gate electrodes 130 may include a metal such as tungsten (W), polycrystalline silicon, or a metal silicide material. For example, the metal silicide material may be a silicide material of a metal selected from cobalt (Co), nickel (Ni), hafnium (Hf), platinum (Pt), tungsten (W), and titanium (Ti).

A diffusion barrier layer 170 may be disposed to surround portions of the gate electrodes 130. For example, the diffusion barrier layer 170 may include tungsten nitride (WN), tantalum nitride (TaN) and/or titanium nitride (TiN).

Interlayer insulating layers 121 to 129 (collectively referred to as interlayer insulating layers 120) may be arranged between the gate electrodes 130. The interlayer insulating layers 120 may also be arranged to be spaced apart from each other in a Z direction and to extend in a Y direction, in a manner similar to the gate electrodes 130. The interlayer insulating layers 120 may include an insulating material such as silicon oxide or silicon nitride.

The gate dielectric layers 160 may be disposed between the gate electrodes 130 and the channel layers 150. As illustrated in FIG. 4, the gate dielectric layer 160 according to some embodiments may include a tunneling layer 162, a charge storage layer 164, and a blocking layer 166 sequentially disposed on the channel layer 150. The tunneling layer 162, the charge storage layer 164, and the blocking layer 166 may be formed in a vertical direction, as in the channel layer 150. A thickness ratio of the layers forming the gate dielectric layer 160 is not limited to that illustrated in the drawing, but may be variously changed.

The tunneling layer 162 may allow for tunneling of a charge, for example, electrons, to be transmitted to the charge storage layer 164 via an F-N tunneling method. The tunneling layer 162 may include, for example, silicon oxide. The charge storage layer 164 may be a charge trapping layer or a floating gate conductive layer. For example, the charge storage layer 164 may include an insulating layer including quantum dots or nanocrystals. In this case, the quantum dots or the nanocrystals may be metal or semiconductor fine particles, and the insulating layer may be a silicon nitride layer.

The blocking layer 166 may include silicon oxide ($SiO_2$), silicon nitride ($Si_3N_4$), silicon oxynitride (SiON), a high-k dielectric material, or a combination thereof. For example, the high-k dielectric material may include aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$).

The channel layers 150 may be extended in a direction (Z direction) substantially perpendicular to an upper surface of the substrate 101, along the channel holes CH penetrating through the gate electrodes 130 and the interlayer insulating layers. In addition, the channel layer 150 may have a form in which a width is narrowed toward the substrate 101 when an aspect ratio of the channel hole CH is increased. The channel layers 150 may be disposed to be spaced apart from each other in X and Y directions. The disposition of the channel layers 150 may be variously changed according to some embodiments. For example, the channel layers 150 may be disposed in a staggered zig-zag form in a single direction. In addition, the channel layers 150 adjacent to each other with a conductive layer 107 therebetween may be disposed symmetrically to each other as illustrated in the drawing, but are not limited thereto.

The channel layers 150 may include a semiconductor material such as polycrystalline silicon or single crystal silicon. For example, the semiconductor material may be an intrinsic semiconductor material or a material including a p-type or n-type impurity.

The channel layer 150 according to some embodiments may have a pipe shape or a macaroni shape, and the interior of the channel layer 150 may be filled with a first insulating layer 182, which may be also called as a "filling insulation".

With reference to FIG. 3, the charge fixing layer 175 according to some embodiments may be disposed between the channel layer 150 and the first insulating layer 182. The charge fixing layer 175 may be formed of a material capable of allowing charges having the same polarity as that of charges of the channel region 150 to be accumulated therein, in such a manner that moving charges in a region of the channel layer 150 adjacent thereto may float. As a result, an effective thickness of the channel layer 150 may be reduced by the charge fixing layer 175. FIG. 5 illustrates the reduction of the effective channel thickness of the channel layer 150 due to the charge fixing layer 175.

With reference to FIG. 5, the charge fixing layer 175 may be disposed to oppose the gate dielectric layer 160, based on the channel layer 150. A negative charge, for example, electrons, may be moved through the channel layer 150, but negative charges accumulated in the charge fixing layer 175 may allow moving electrons in a region of the channel layer 150 adjacent thereto to float. An effective thickness te of the channel layer 150 may be reduced as compared to an actual physical thickness tp by such self-floating. In some embodiments, for example, when the channel layer 150 is formed of polycrystalline silicon, electrons may be trapped in a, grain boundary GB, but electrons trapped by the charge fixing layer 175 may also effectively float.

As such, as the effective thickness te of the channel layer 150 is reduced, a threshold voltage as well as swing and current characteristics may also be effectively improved. For example, even when the actual physical thickness tp is not reduced, since the effect of a reduction such as an effective channel thickness te may be obtained, a defect such as disconnection occurring in the channel layer 150 having an extremely low thickness may be significantly reduced. Thus, even when the physical thickness of the channel layer 150 is designed to have, for example, 60 Å or higher, in consideration of a margin to prevent a disconnection defect after trimming, the effective thickness te may be reduced to 40 Å to 60 Å using the charge fixing layer 175. For example, even when the channel layer 150 is formed to have a thickness of 60 Å to 130 Å, the channel layer 150 may have about 40 Å or less of low effective thickness in terms of an electrical aspect.

As a material of the charge fixing layer 175, a material providing a fixed negative charge effect may be used, and for example, a high-k material or a metal may be used. For example, an example of the high-k material may include aluminum oxide ($Al_2O_3$), hafnium oxide ($HfO_2$), lanthanum oxide ($La_2O_3$), lanthanum aluminum oxide ($LaAl_xO_y$), lanthanum hafnium oxide ($LaHf_xO_y$), and/or hafnium aluminum oxide ($HfAl_xO_y$). In some example embodiments, an example of the high-k material may include $Al_2O_3$, $HfO_2$, $La_2O_3$, $LaAl_xO_y$, $LaHf_xO_y$, and/or $HfAl_xO_y$. For example, an example of the metal may include aluminum, hafnium, and/or lanthanum.

An upper end of the charge fixing layer 175 may be positioned to be higher than an upper surface of an uppermost gate electrode 138, for example, SST, among the gate electrodes 130. As illustrated in FIG. 3, a distance d1 between an upper end of the charge fixing layer 175 and an upper surface of the uppermost gate electrode 138 may be secured, such that the effect of a reduction in channel thickness may also be stably obtained in an uppermost channel region. In some embodiments, for example, the distance d1 may be at least 100 Å.

As illustrated in FIG. 2, the charge fixing layer 175 may be continuously disposed on a surface of the channel layer 150 in such a manner that regions thereof corresponding to the gate electrodes 130 may all be covered.

The charge fixing layer 175 according to some embodiments may be physically separated from a conductive pad 192 to be blocked from contacting the conductive pad 192. As illustrated in FIG. 3, the charge fixing layer 175 and the conductive pad 192 may be separated from each other by the first insulating layer 182. An element contained in the charge fixing layer 175 may disturb a deposition of a material for the conductive pad 192. For example, when polycrystalline silicon for the conductive pad 192 is deposited, the growth of polycrystalline silicon may not be properly performed by a metal element contained in the charge fixing layer 175, such as Al. In order to prevent the occurrence thereof, the charge fixing layer 175 may be covered by the first insulating layer 182.

Selective etching may be applied thereto in such a manner that the charge fixing layer 175 may be located to be positioned lower than the conductive pad 192. To this end, an insulating film 181 serving as a mask on a surface of the charge fixing layer 175 may be added (see processes of FIGS. 13 to 16). The insulating film 181 may be formed of an insulating material having etching selectivity with respect to the charge fixing layer 175. For example, the insulating film 181 may be formed of silicon oxide ($SiO_2$). The insulating film 181 may be formed of the same material as that of the first insulating layer 182. In this case, as illustrated in FIG. 2, for example, when the first insulating layer 182 fills the interior of the channel layer 150, the first insulating layer 182 may not be distinguished from the channel layer 150 in a final product.

An epitaxial layer 140 may be disposed between the channel layer 150 and the substrate 101, and may be in contact with the channel layer 150 and the substrate 101. The channel layer 150 may be electrically connected to the substrate 101 via the epitaxial layer 140. The epitaxial layer 140 may be disposed on a recessed region R of the substrate 101. In some embodiments, the epitaxial layer 140 may fill the recessed region R while being extended to be higher than an upper surface of the substrate 101. For example, an upper surface of the epitaxial layer 140 may be higher than an upper surface of a lowermost gate electrode 131 and may be lower than a lower surface of the gate electrode 132. The upper surface of the epitaxial layer 140 may have an inclined surface of which a central portion is convex. The epitaxial layer 140 may be a semiconductor material layer formed using selective epitaxial growth (SEG). The epitaxial layer 140 may include silicon (Si), germanium (Ge), or silicon-germanium (SiGe), doped or not doped with an impurity.

In an upper end portion of the memory cell string, the conductive pad 192 may be disposed on the first insulating layer 182 to be separated from the charge fixing layer 175 and to be electrically connected to the channel layer 150. For example, the conductive pad 192 may include doped polycrystalline silicon. The conductive pad 192 may serve as a drain region of the string select transistor SST (see FIG. 1). The conductive pad 192 may be electrically connected to a bit line 195 via a contact plug 194.

In a lower end portion of the memory cell string, impurity regions 105 arranged in an X direction may be provided. The impurity regions 105 may be spaced apart from each other by a predetermined distance in an X direction while extending in a Y direction and being adjacent to an upper surface of the substrate 101. For example, in some embodiments, one impurity region 105 may be disposed with respect to every two channel layers 150 in the X direction, but embodiments of the inventive concepts are not limited thereto. The impurity regions 105 may serve as source regions of the ground select transistors GST (see FIGS. 1 and 2).

The conductive layer 107 may be disposed on the impurity region 105 to extend in a Y direction. The conductive layer 107 may include a conductive material. For example, the conductive layer 107 may include tungsten (W), aluminum (Al), or copper (Cu). The conductive layer 107 may be electrically isolated from the gate electrodes 130 by a second insulating layer 184.

Figure 6A:
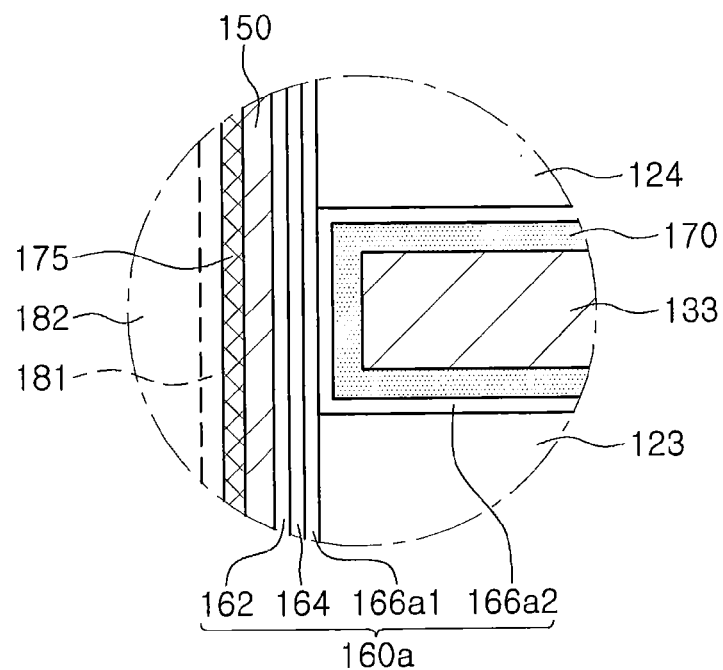
FIGS. 6A and 6B are cross-sectional views of other examples of a gate dielectric layer according to some embodiments of the inventive concepts.
Figure 6B:
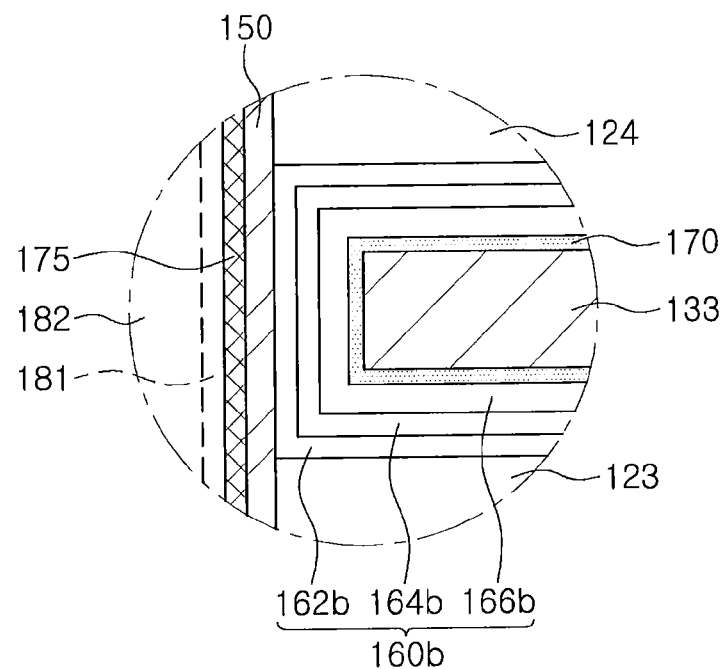

The semiconductor device according to some embodiments may be variously changed. For example, a gate dielectric layer may be applied in a form different therefrom. FIGS. 6A and 6B are cross-sectional views illustrating various examples of a gate dielectric layer according to some embodiments of the inventive concepts. Semiconductor devices according to the embodiments illustrated in FIGS. 6A and 6B may be similar to the semiconductor devices described above with respect to FIGS. 1 through 5 except for the differences described below. Reference numerals the same as or similar to those described in the foregoing embodiments represent the same or similar elements, and descriptions thereof may be omitted or briefly described in the following description in order to simplify the description.

Referring to FIG. 6A, a gate dielectric layer 160a may have a structure in which a tunneling layer 162, a charge storage layer 164, and first and second blocking layers 166a1 and 166a2 are sequentially stacked on the channel layer 150.

The gate dielectric layer 160a may include first and second blocking layers 166a1 and 166a2, differently from the gate dielectric layer 160 that is illustrated in FIG. 4. The first blocking layer 166a1 may extend in a vertical direction, as in the channel layer 150, and the second blocking layer 166a2 may be disposed to surround a gate electrode layer 133 and a diffusion barrier layer 170. For example, the second blocking layer 166a2 may include a material having a higher dielectric constant than that of the first blocking layer 166a1.

Referring to FIG. 6B, the gate dielectric layer 160b may have a structure in which a tunneling layer 162b, a charge storage layer 164b, and a blocking layer 166b are sequentially stacked on the channel layer 150. In the case of the gate dielectric layer 160b according to some embodiments, in a structure different from that of FIG. 4, the tunneling layer 162b, the charge storage layer 164b, and the blocking layer 166b may be disposed to surround both of the gate electrode layer 133 and the diffusion barrier layer 170.

FIGS. 7 to 24 are cross-sectional views illustrating methods of manufacturing semiconductor devices according to some embodiments of the inventive concepts. FIGS. 7 to 24 may be understood as cross-sectional views of the semiconductor device illustrated in FIG. 2, taken in X-Z directions.

Figure 7:
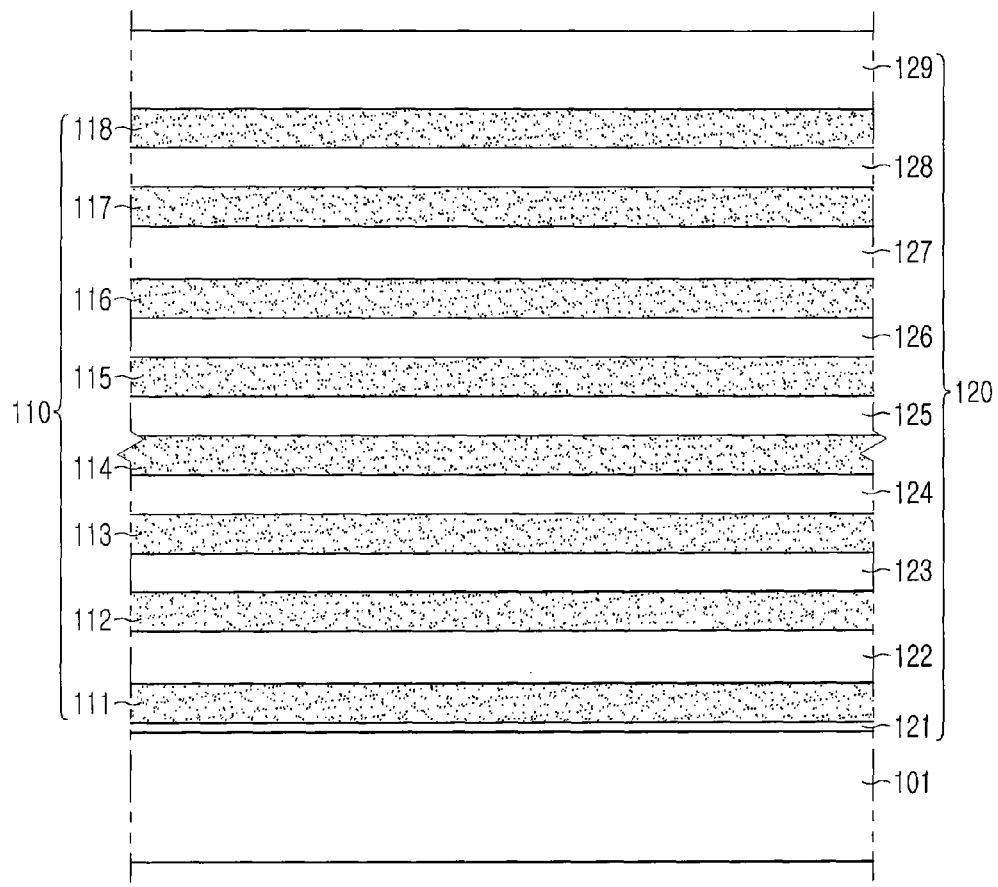
FIGS. 7 to 24 are cross-sectional views illustrating methods of manufacturing semiconductor devices according to some embodiments of the inventive concepts.

With reference to FIG. 7, sacrificial layers 111 to 118 (collectively referred to as sacrificial layers 110) and interlayer insulating layers 121 to 129 (collectively referred to as interlayer insulating layers 120) may be alternately stacked on a substrate 101.

The sacrificial layers 110 may be formed of a material that may be etched with etch selectivity with respect to the interlayer insulating layers 120. For example, the interlayer insulating layers 120 may include silicon oxide and/or silicon nitride, and the sacrificial layers 110 may include silicon, silicon oxide, silicon carbide, and/or silicon nitride, as a different material having etch selectivity with respect to the interlayer insulating layer 120.

As in some embodiments, thicknesses of the interlayer insulating layers 120 may be different from each other. From among the interlayer insulating layers 120, a lowermost interlayer insulating layer 121 may be formed to have a relatively reduced thickness, and an uppermost interlayer insulating layer 129 may be formed to be relatively thick. In addition, thicknesses of interlayer insulating layers 122 and 127 may be relatively increased as compared to those of interlayer insulating layers 123 to 126, but the thickness and/or the number of the interlayer insulating layers 120 and the sacrificial layers 110 may be variously changed.

Figure 8:
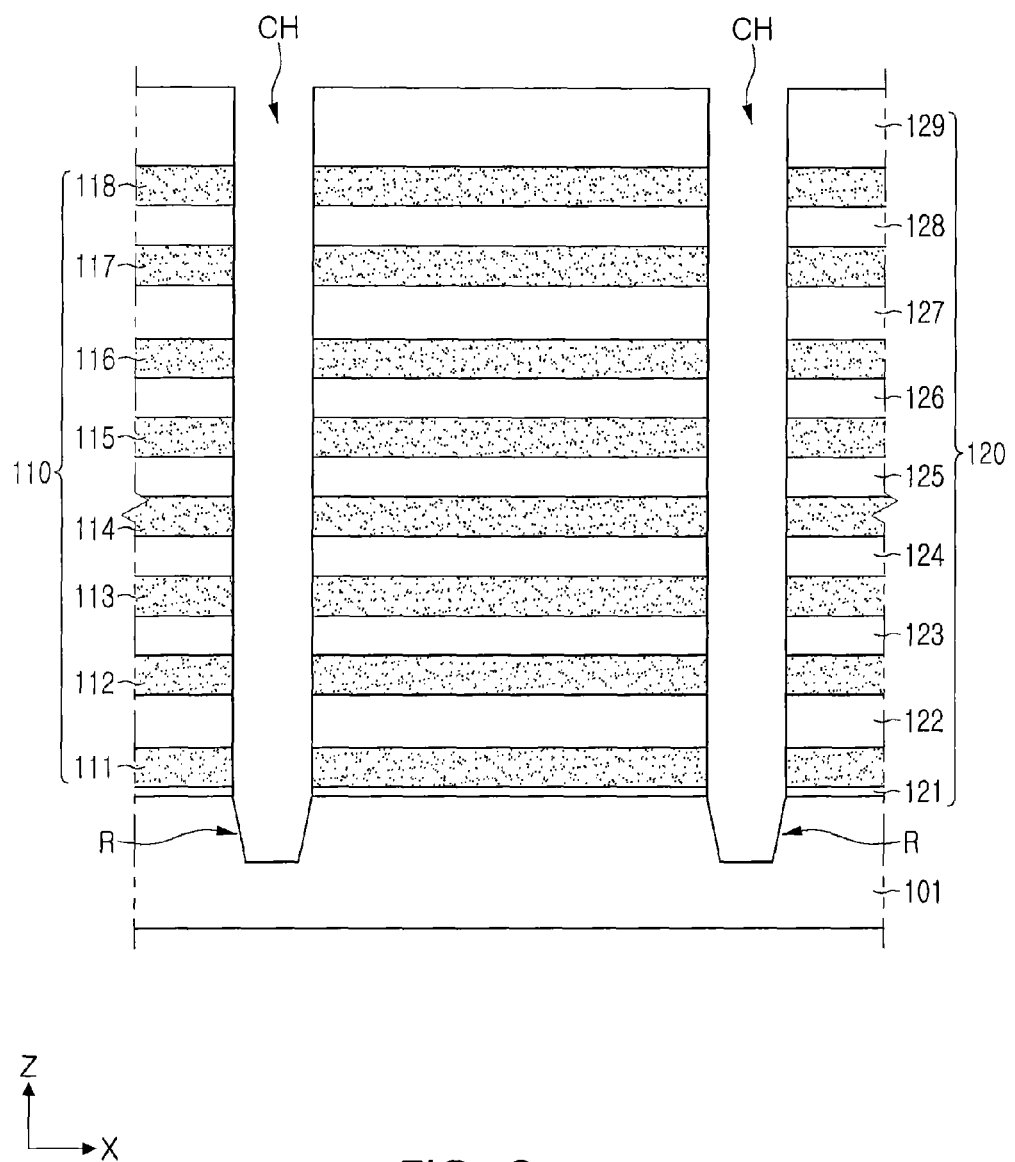

With reference to FIG. 8, channel holes CH may be formed to penetrate the sacrificial layers 110 and the interlayer insulating layers 120.

The channel holes CH may be extended to the substrate 101 in a Z direction to form a recessed region R in the substrate 101. The channel holes CH may be formed by anisotropically forming the sacrificial layers 110 and the interlayer insulating layers 120. In some example embodiments, side walls of the channel holes CH may not be perpendicular to an upper surface of the substrate 101. For example, widths of the channel holes CH may be reduced toward the upper surface of the substrate 101.

Figure 9:
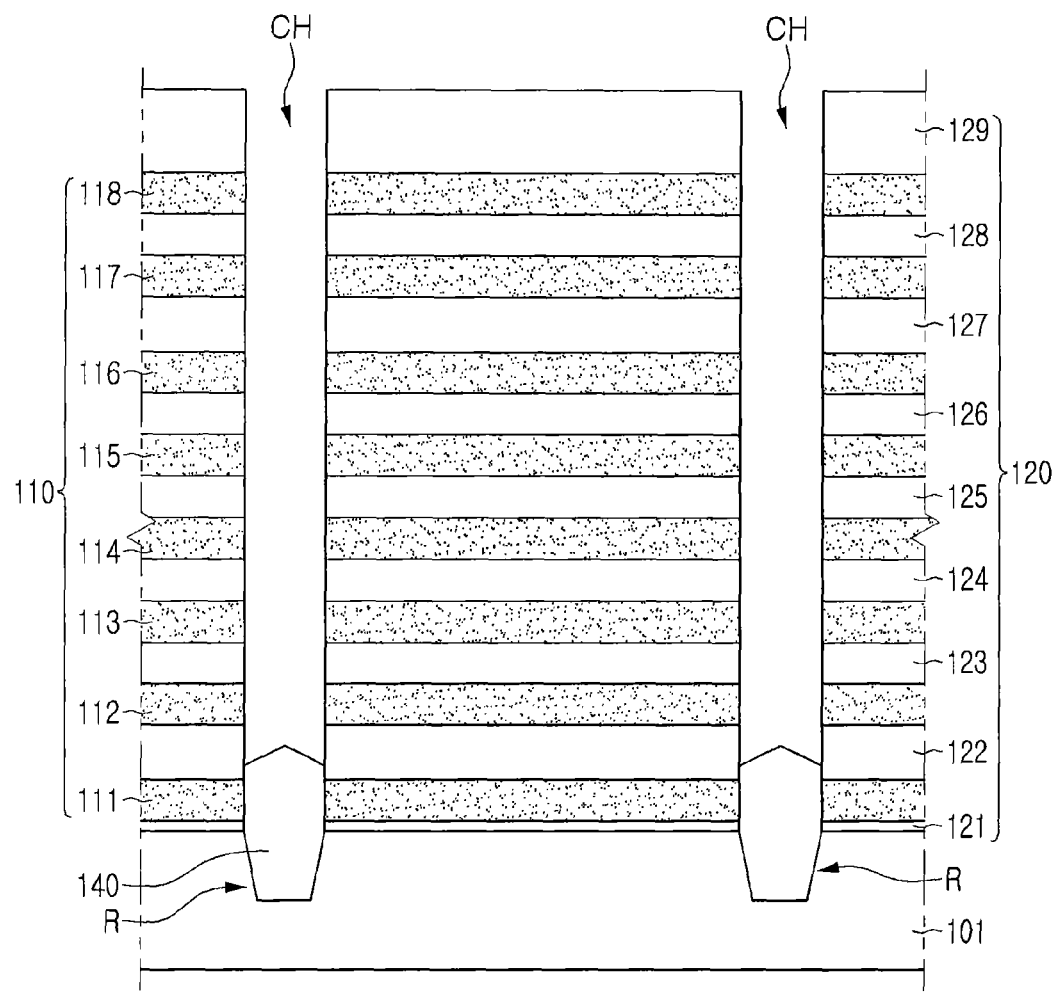

With reference to FIG. 9, epitaxial layers 140 may be formed in the recessed regions R in lower portions of the channel holes CH:

The epitaxial layer 140 may be formed by performing selective epitaxial growth (SEG), by using the substrate 101 in the recessed region R as a seed. The epitaxial layer 140 may be configured of a single layer, or may be configured of a plurality of layers grown under different conditions or having different compositions.

The epitaxial layer 140 may be doped with an impurity. The impurity may be the same conductivity-type impurity as that of an impurity of the substrate 101 or an opposite conductivity-type impurity thereto.

An upper surface of the epitaxial layer 140 may be higher than an upper surface of a sacrificial layer 111 adjacent to the substrate 101. In addition, an upper surface of the epitaxial layer 140 may be formed to be convex in a direction away from the substrate 101, while the epitaxial layer 140 may also have a substantially flat upper surface according to a growth condition or the like.

Figure 10:
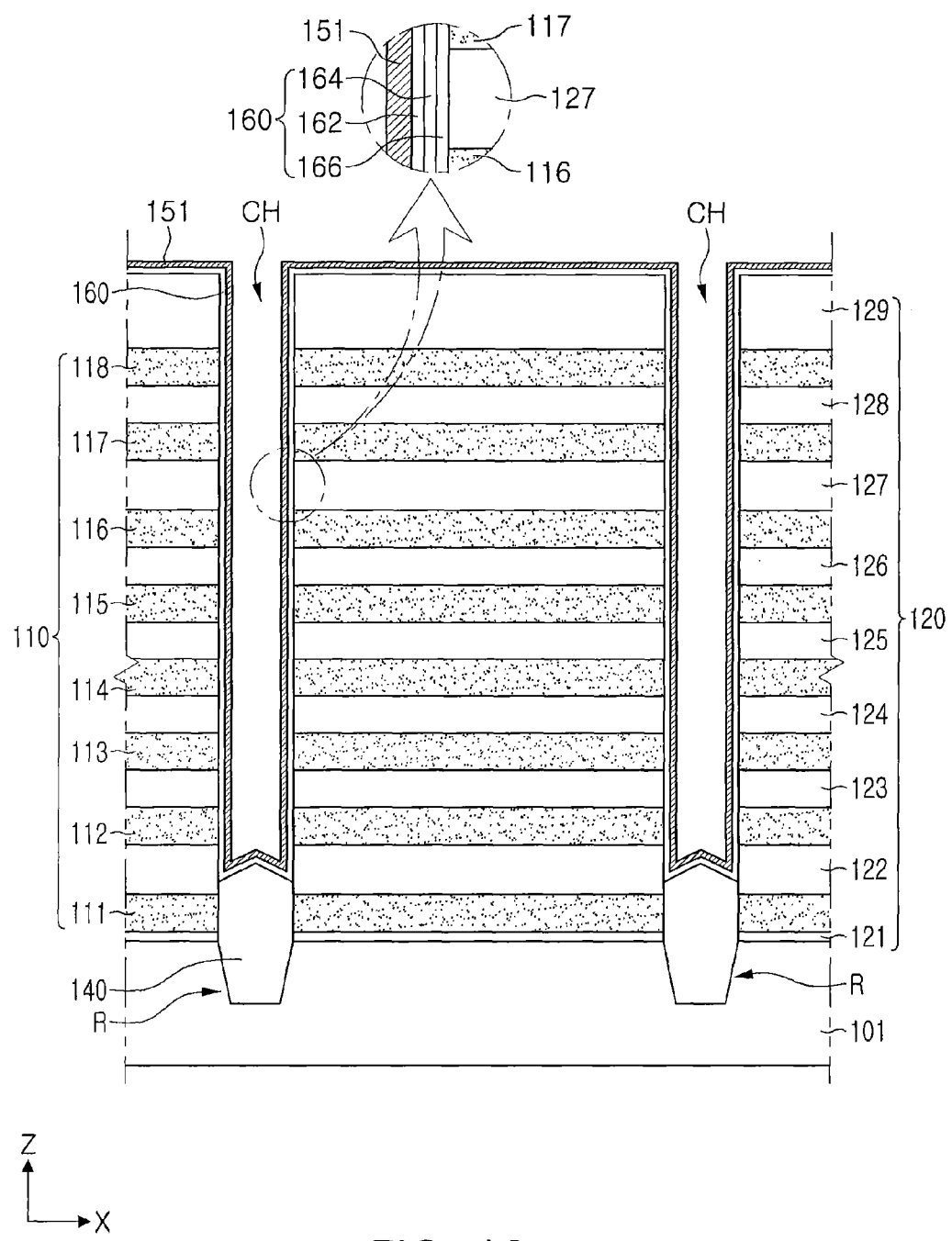

With reference to FIG. 10, a gate dielectric layer 160 and a sacrificial semiconductor film 151 may be formed within the channel holes CH.

The gate dielectric layer 160 may be formed on sidewalls of the channel holes CH, upper surfaces of the epitaxial layers 140, and an upper surface of the interlayer insulating layer 129 at a uniform thickness. In some embodiments, the gate dielectric layer 160 may be formed by sequentially depositing a blocking layer 166, a charge storage layer 164, and a tunneling layer 162. The sacrificial semiconductor film 151 may be formed to have a uniform thickness on the gate dielectric layer 160. The sacrificial semiconductor film 151 may be formed of a semiconductor material such as polycrystalline silicon or amorphous silicon. For example, the sacrificial semiconductor film 151 may be a polycrystalline silicon semiconductor layer. The gate dielectric layer 160 and the sacrificial semiconductor film 151 may be formed using atomic layer deposition (ALD) or chemical vapor deposition (CVD).

Figure 11:
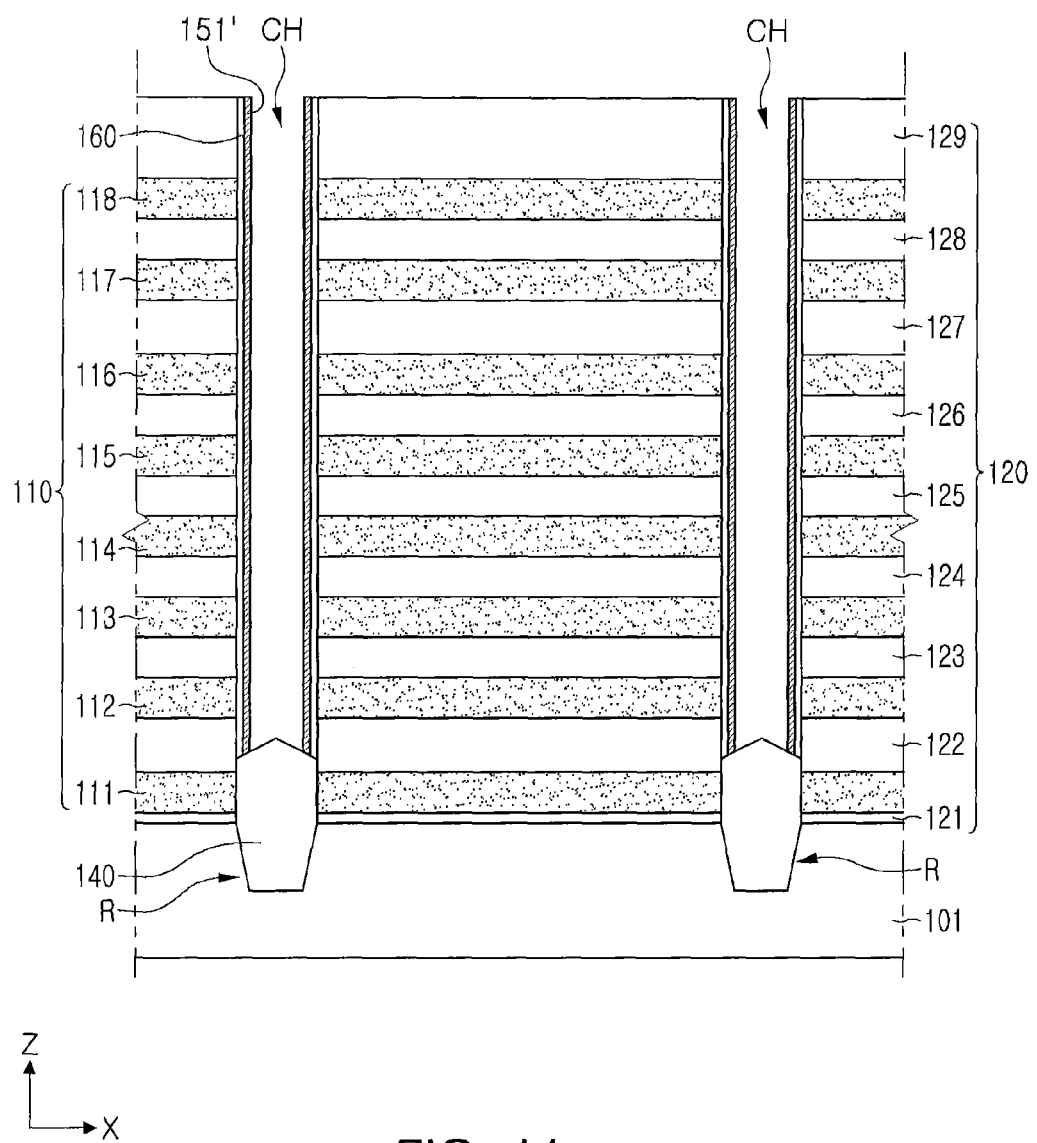

With reference to FIG. 11, portions of the gate dielectric layer 160 and the sacrificial semiconductor film 151 may be removed to allow the epitaxial layer 140 to be exposed within the channel holes CH.

An exposed region of the epitaxial layer 140 may be provided as a connection region thereof connected to the channel layer 150 in a subsequent process. In some embodiments, a sacrificial spacer layer 151' disposed on a sidewall of the gate dielectric layer 160 may be obtained by anisotropically etching the sacrificial semiconductor film 151. Subsequently, the gate dielectric layer 160 exposed by using the sacrificial spacer layer 151' as an etching mask may be anisotropically etched to thus be selectively removed. On the other hand, during the anisotropical etching, the gate dielectric layer 160 may remain on a sidewall of the channel hole CH by the sacrificial spacer layer 151'. For example, when the gate dielectric layer 160 is etched, the epitaxial layer 140 may also be partially etched.

Figure 12:
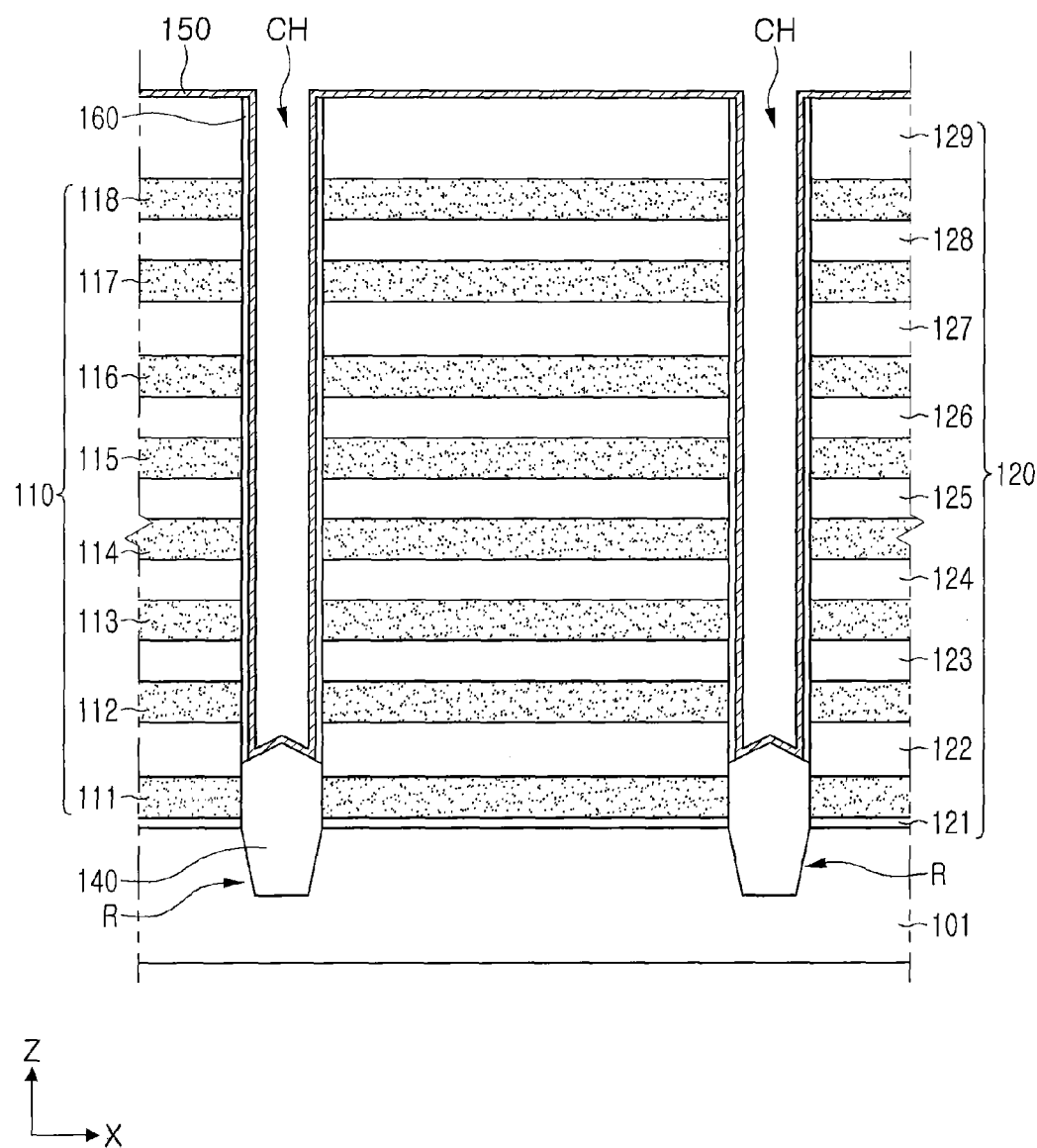

With reference to FIG. 12, after the sacrificial spacer layer 151' is removed, the channel layer 150 may be formed on the gate dielectric layer 160 within the channel holes CH.

The sacrificial spacer layer 151' may be selectively removed to prevent the gate dielectric layer 160 from being damaged. The channel layer 150 may be formed using atomic layer deposition (ALD) or chemical vapor deposition (CVD). In some embodiments, the channel layer 150 may also be formed on an upper surface of an uppermost interlayer insulating layer, but may be removed in a subsequent process. The channel layer 150 may include a semiconductor material such as polycrystalline silicon or amorphous silicon. The channel layer 150 may be connected to the epitaxial layer 140.

For example, when the channel layer 150 is formed of polycrystalline silicon, the channel layer 150 may be formed more thickly than a required final thickness in order to prevent disconnection of the channel layer 150, and after that, may be adjusted to have the required final thickness using a trimming process. The trimming process may be accurately performed using a solution, for example, a SC1 solution. The SC1 solution may be a solution obtained by mixing deionized water, $NH_4OH$ and $H_2O_2$ with each other at a ratio of 5:1:1.

Figure 13:
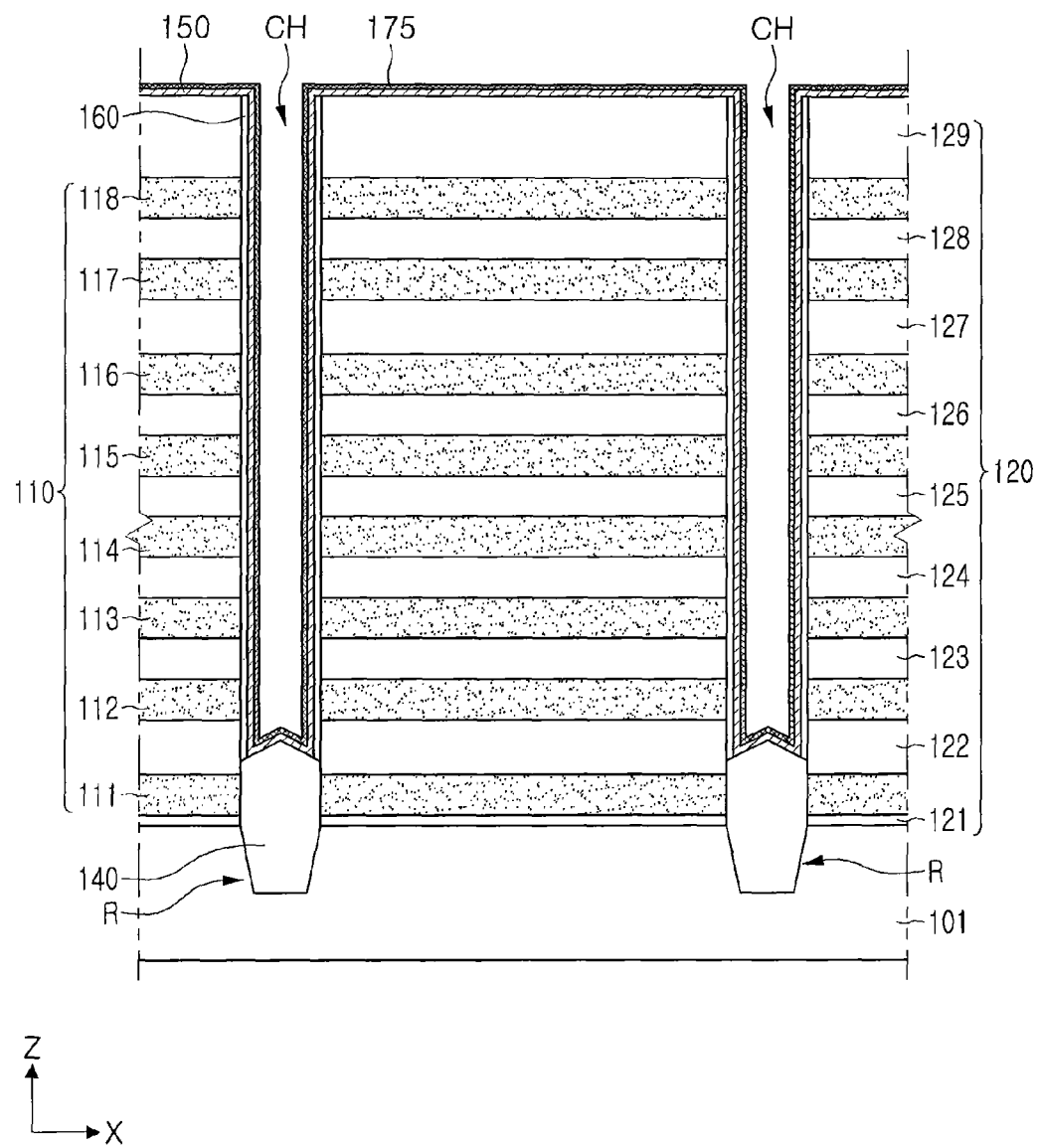

Referring to FIG. 13, the charge fixing layer 175 may be formed on the channel layer 150.

The charge fixing layer 175 may be formed of a material capable of allowing charges having the same polarity as that of charges of the channel region 150 to be accumulated therein, in such a manner that moving charges in a region of the channel layer 150 adjacent thereto may float. As illustrated above, the charge fixing layer 175 may be formed of a high-k material or a metal. The charge fixing layer 175 may be formed in a process similar to that of the channel layer 150. For example, the charge fixing layer 175 may be formed using atomic layer deposition or chemical vapor deposition. Although not particularly limited, a thickness of the charge fixing layer 175 may be within a range of 10 Å to 200 Å. The charge fixing layer 175 may be continuously formed on a surface of the channel layer 150. In addition, since the charge fixing layer 175 may affect a change in effective thickness of the channel layer 150, the charge fixing layer 175 may be formed to have a uniform thickness over the surface of the channel layer 150, such that a degree of reduction therein may be constant.

Figure 14:
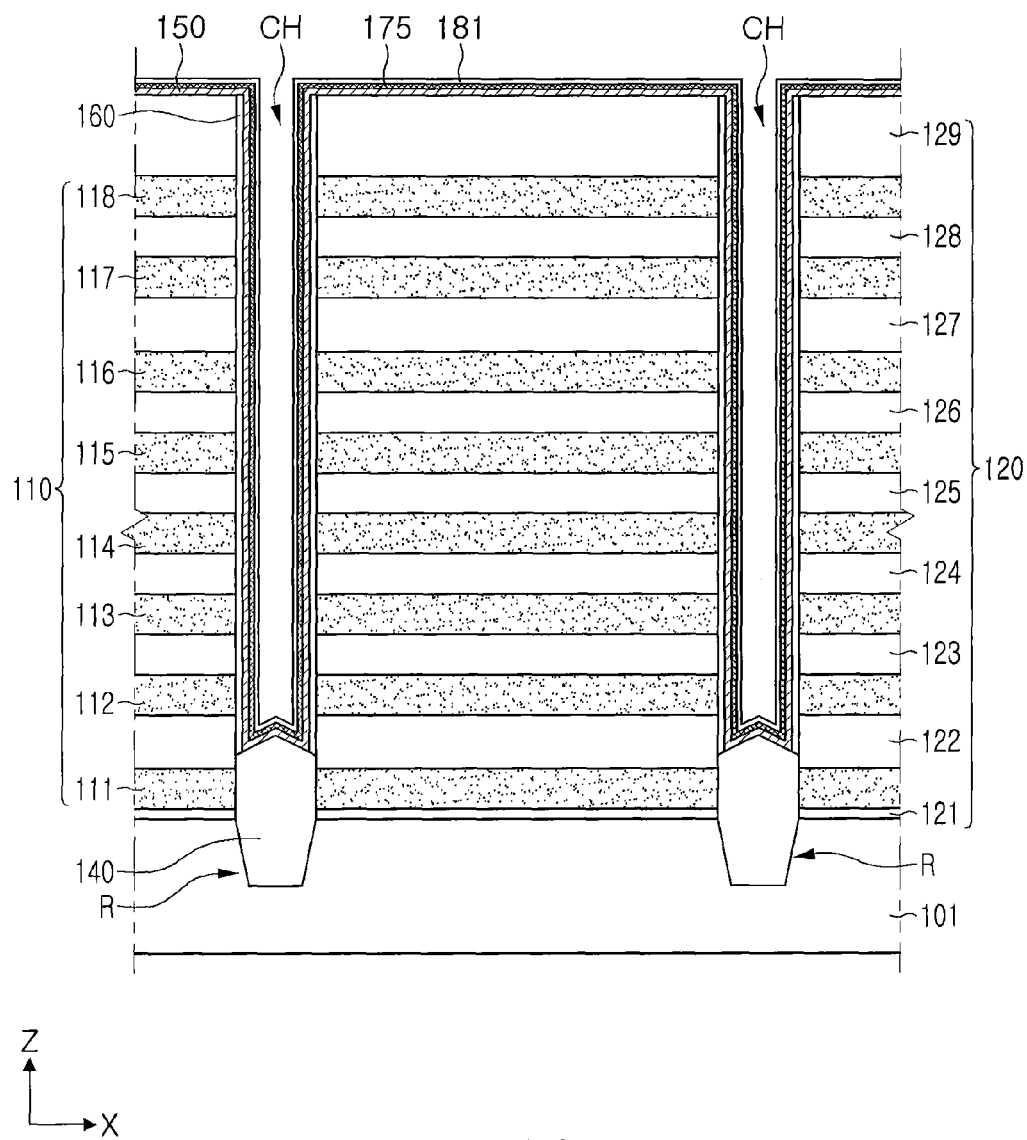

Referring to FIG. 14, an insulating film 181 may be formed on the charge fixing layer 175.

The insulating film 181 formed in the example process may be used as a mask used to remove a portion of an upper end of the charge fixing layer 175. In detail, before a gap fill process, a portion of the charge fixing layer 175 may be removed from an upper end of the channel hole CH, in such a manner that the charge fixing layer 175 may be physically separated from the conductive pad 192 (see FIG. 2). In the selective removal process as above, the insulating film 181 may be used as a mask (see FIGS. 15 and 16). Therefore, the insulating film 181 may be formed using a material having a relatively high etch selectivity with respect to the charge fixing layer 175. For example, the insulating film 181 may be formed using silicon oxide, silicon nitride, or silicon oxynitride. The insulating film 181 may be formed using atomic layer deposition or chemical vapor deposition.

Figure 15:
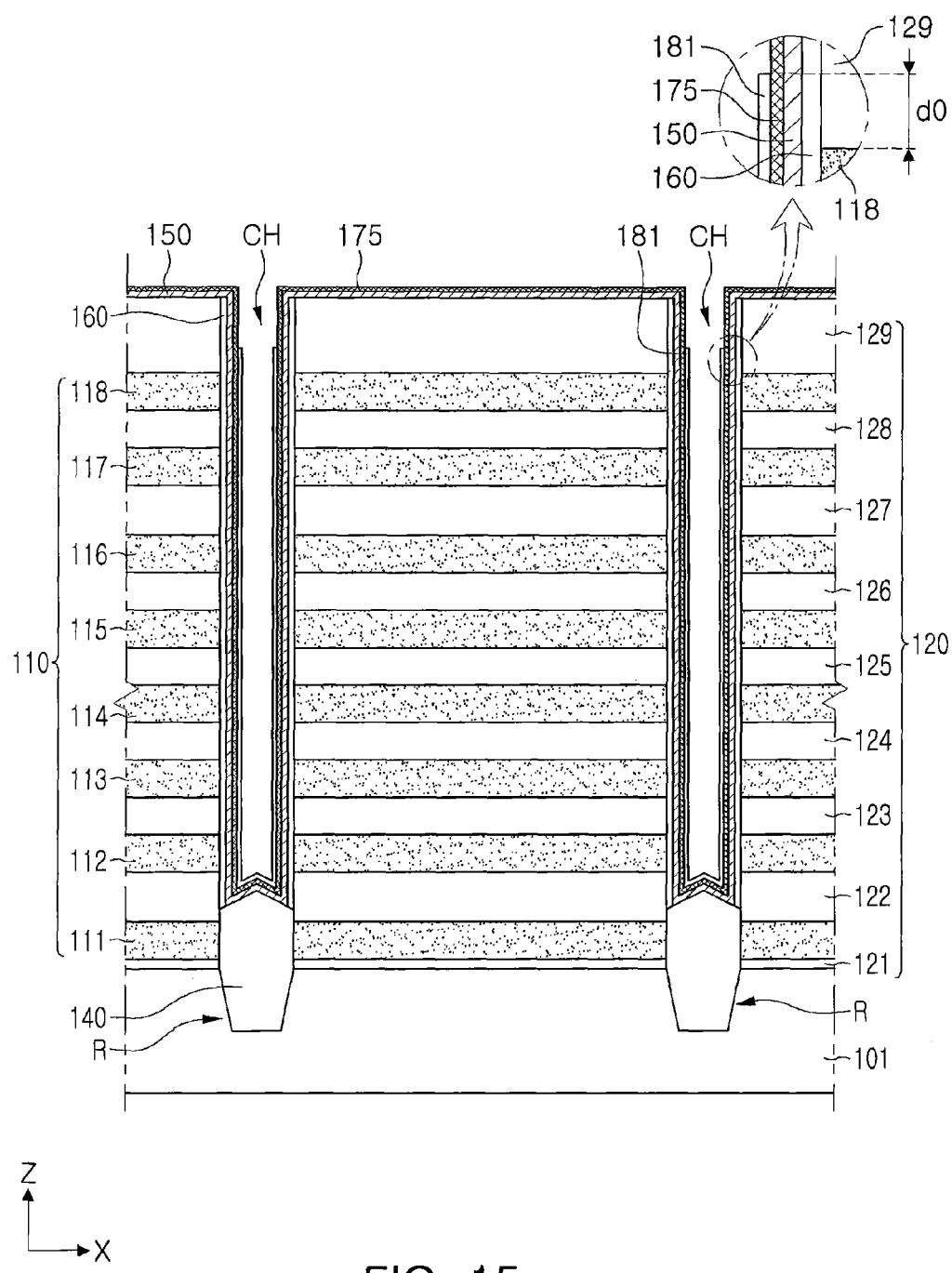

With reference to FIG. 15, an upper end portion of the insulating film 181, located inside the channel hole CH, may be selectively etched and removed.

In this etching process, the upper end portion of the insulating film 181 located within the channel hole CH may be selectively removed together with the removal of a portion thereof located on a stacked structure or the uppermost interlayer insulating layer 129. By the selective removal of the insulating film 181, a portion of the charge fixing layer 175 to be removed may be exposed, and remaining portions of the charge fixing layer 175 for respective channel regions may be protected by a remaining portion of the insulating film 181. An upper end portion of the insulating film 181 obtained in the etching process may be located on a level higher than that of an uppermost sacrificial layer 118, for example, a final SSL line, by a predetermined distance d0 within the channel hole CH. The upper end of the insulating film 181 may be positioned to be higher than a required upper surface of a final charge fixing layer 175 in consideration of a portion of the charge fixing layer 175 which may be overetched in a subsequent process.

Figure 16:
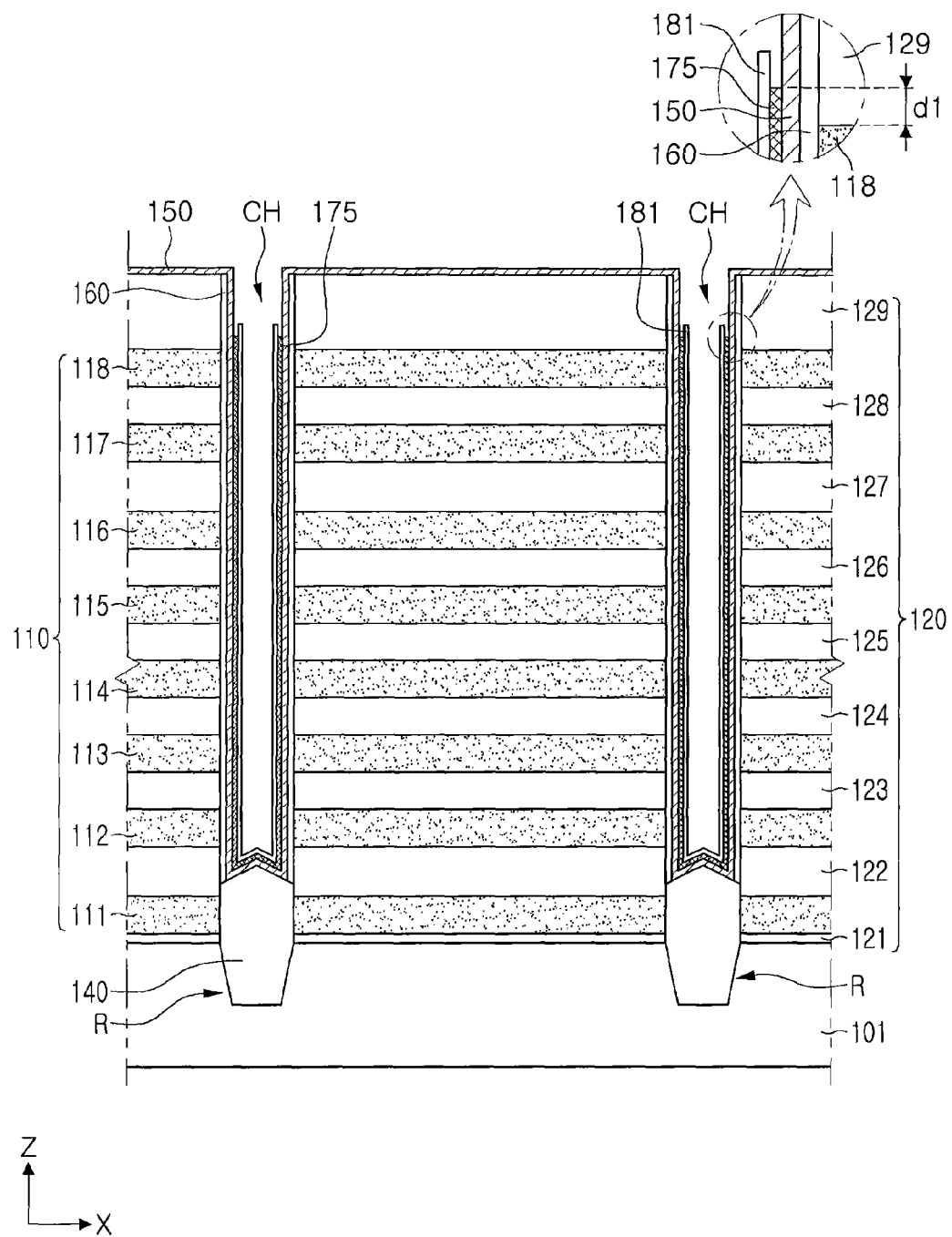

Referring to FIG. 16, an upper end portion of the charge fixing layer 175 may be removed by using the insulating film 181 as a mask.

In this etching process, an upper end portion of the charge fixing layer 175 located within the channel hole CH may be selectively removed by using the insulating film 181 as a mask, together with removal of a portion thereof located on a stacked structure or the uppermost interlayer insulating layer 129. Thus, the charge fixing layer 175 may be physically separated from the conductive pad 192 (see FIG. 2) in a subsequent process. In addition, the insulating film 181 may protect the charge fixing layer 175 in such a manner that portions of the charge fixing layer 175 relevant to channel regions may be prevented from being damaged in an etching process.

In some embodiments, a portion of the charge fixing layer 175 may be overetched from an upper end of the insulating film 181. An upper end of the charge fixing layer 175 may be located to be lower than an upper surface of the insulating film 181.

An upper end portion of the charge fixing layer 175 obtained in the etching process may be positioned to be higher than the uppermost sacrificial layer 118, for example, a final SSL line SSL, by a predetermined distance d1 within the channel hole CH. As such, the remaining charge fixing layer 175 may be formed to cover channel regions associated with gate electrodes formed in a subsequent process. In this case, the etching process may be controlled to sufficiently cover respective channel regions, in such a manner that the distance d1 may be 100 Å or more.

Figure 17:
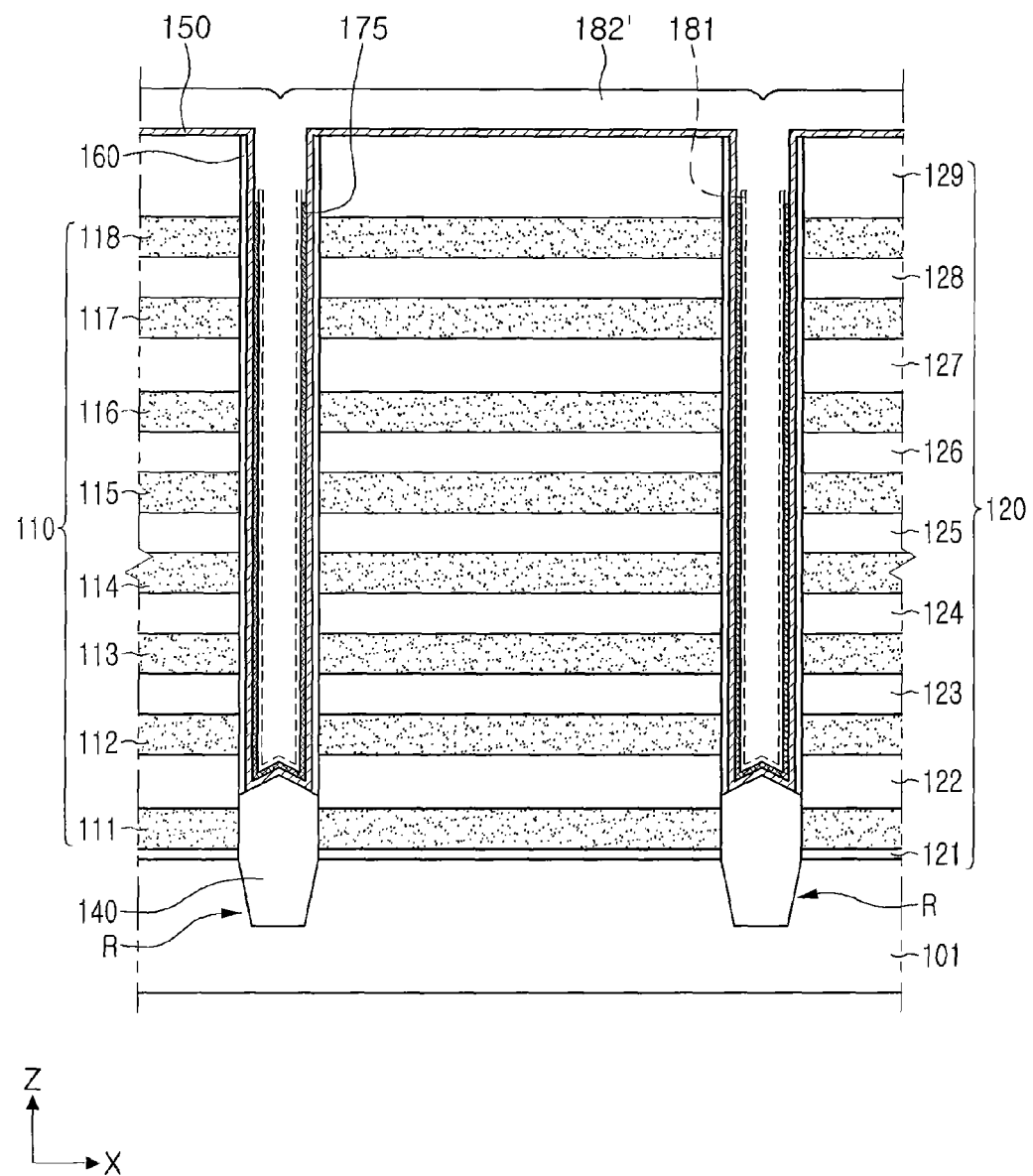
Figure 18:
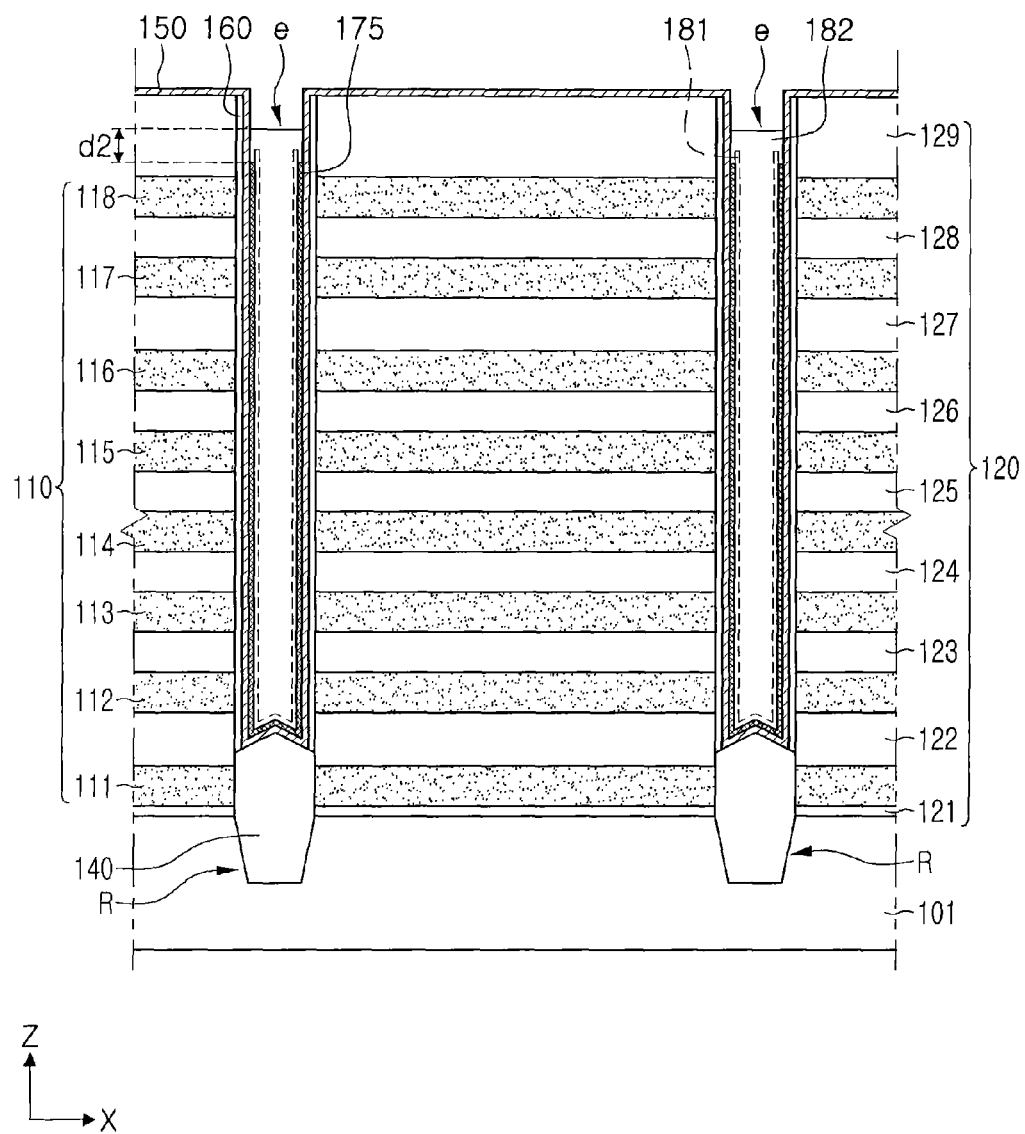

Referring to FIGS. 17 and 18, the first insulating layer 182 may be formed to allow the interior of the channel layer 150 to be filled therewith.

In a process of forming the first insulating layer, a first insulating material 182' for the first insulating layer may be deposited to sufficiently fill the interior of the channel layer 150 therewith (see FIG. 17), and a portion (e) of an upper end of the channel hole CH may be open using an etchback process (see FIG. 18). The open upper portion (e) may be provided as a region in which the conductive pad 192 (see FIG. 20) is to be formed. The first insulating layer 182 may be a silicon oxide layer. In some embodiments, for example, when the first insulating layer 182 is formed of the same material as that of the insulating film 181, the first insulating layer 182 and the insulating film 181 may not be discernable therebetween. In a different manner, if the first insulating layer 182 and the insulating film 181 are formed of different materials, two layers thereof may be discerned from each other in a final product.

Figure 19:
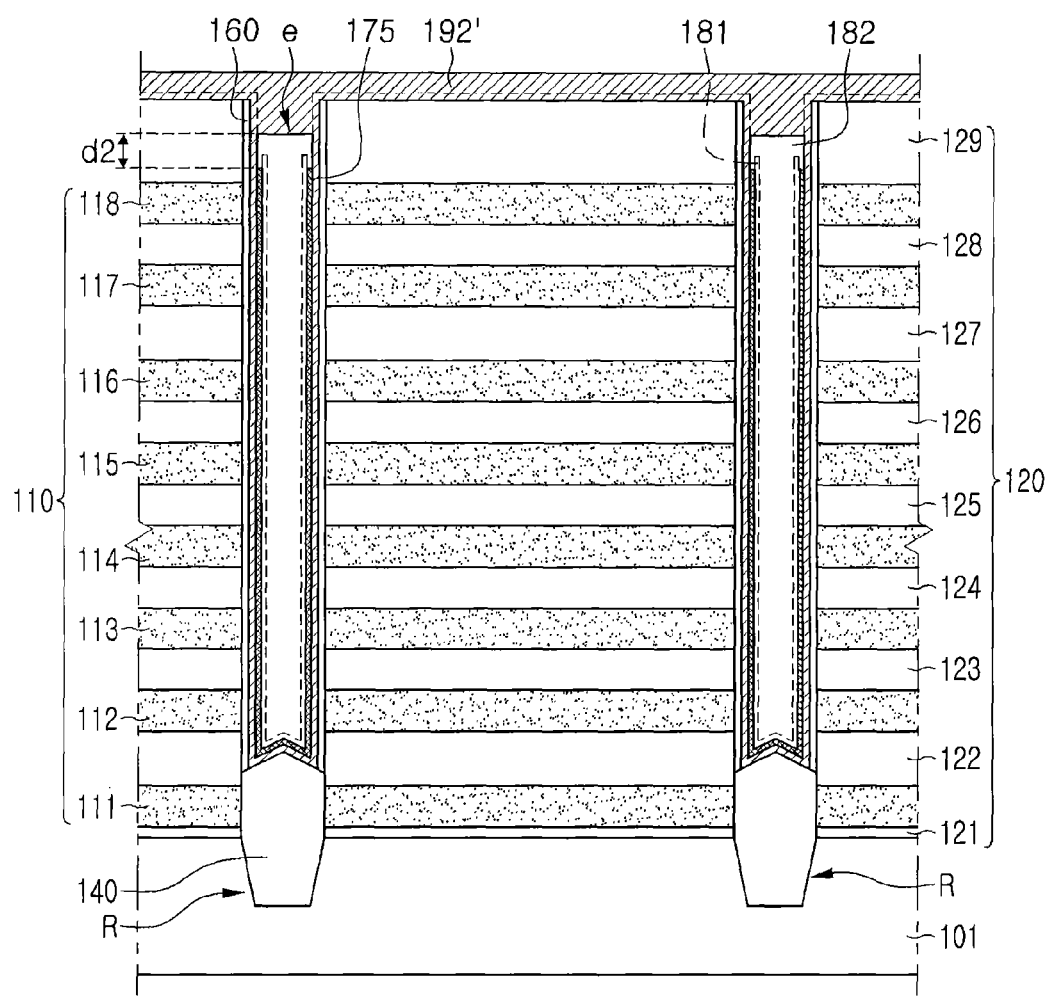
Figure 20:
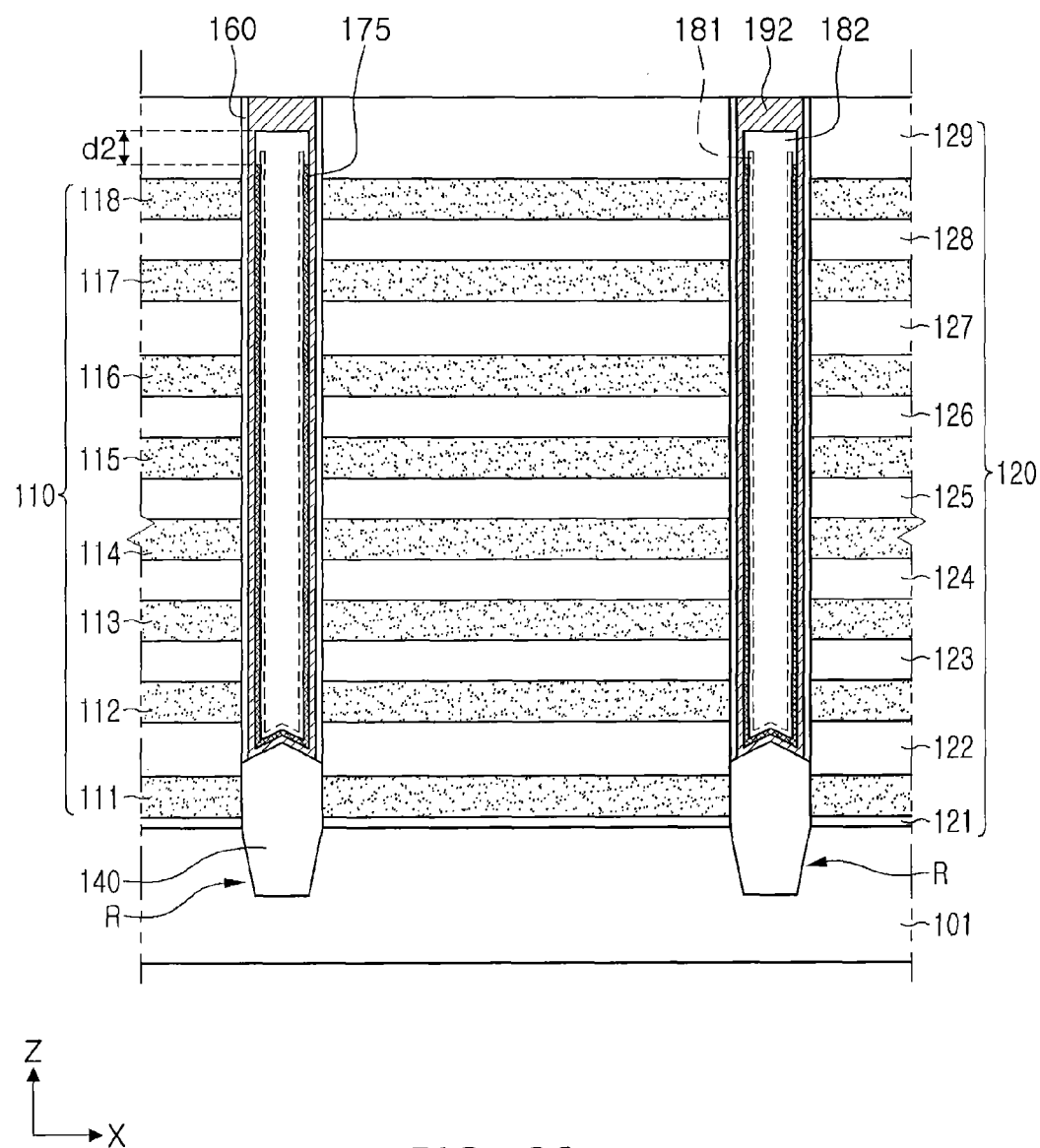

Referring to FIGS. 19 and 20, the conductive pad 192 may be formed on the first insulating layer 182.

In a process of forming the conductive pad, a sufficient amount of conductive material may be formed to fill the open upper portion (e) of the channel hole (see FIG. 19), and a portion of a conductive material 192' located on the stacked structure or the uppermost interlayer insulating layer 129 may be removed using an etchback process or a polishing process (see FIG. 20). The conductive material 192' and/or the conductive pad 192 may include doped polycrystalline silicon. In some embodiments, the conductive pad 192 may be separated from the charge fixing layer 175 by the first insulating layer 182 by a predetermined distance d2. Thus, a reduction in growth of polycrystalline silicon due to an element forming the charge fixing layer 175, for example, Al, may be prevented.

Figure 21:
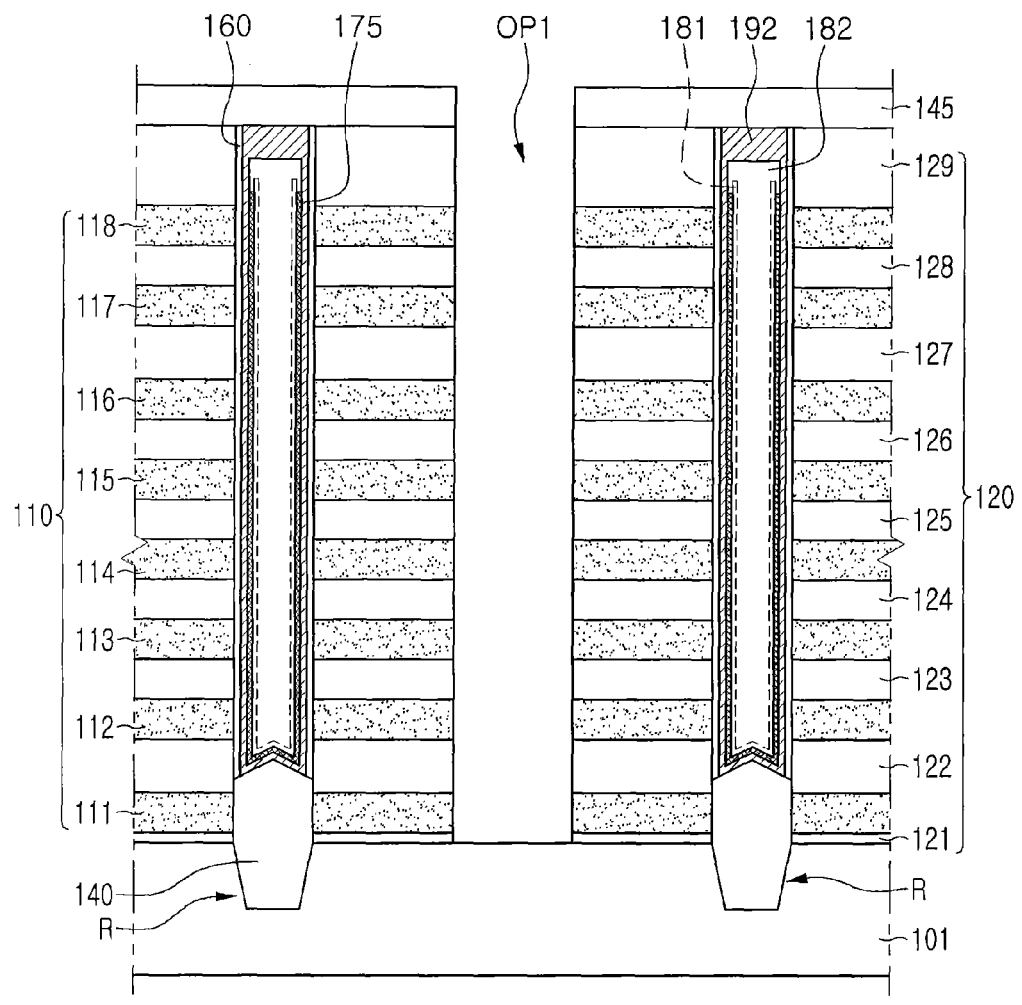

With reference to FIG. 21, a first opening OP1 may be formed to allow a stacked structure including sacrificial layers 110 and interlayer insulating layers 120 to be divided into a plurality of regions to thus have a predetermined interval therebetween.

Prior to the process described above, for example, before the first opening OP1 is formed, additionally, a protective insulating layer 145 may be formed on the uppermost interlayer insulating layer 129 and the conductive pad 192. The protective insulating layer 145 may prevent damage to the conductive pad 192 and the channel layer 150 during a subsequent process. The first opening OP1 may be formed by forming a mask layer using a photolithography process and anisotropically etching the sacrificial layers 110 and the interlayer insulating layers 120. The first opening OP1 may be formed in a trench structure extending in a Y direction (see FIG. 2). The first opening OP1 may allow the substrate 101 to be exposed between the channel layers 150.

Figure 22:
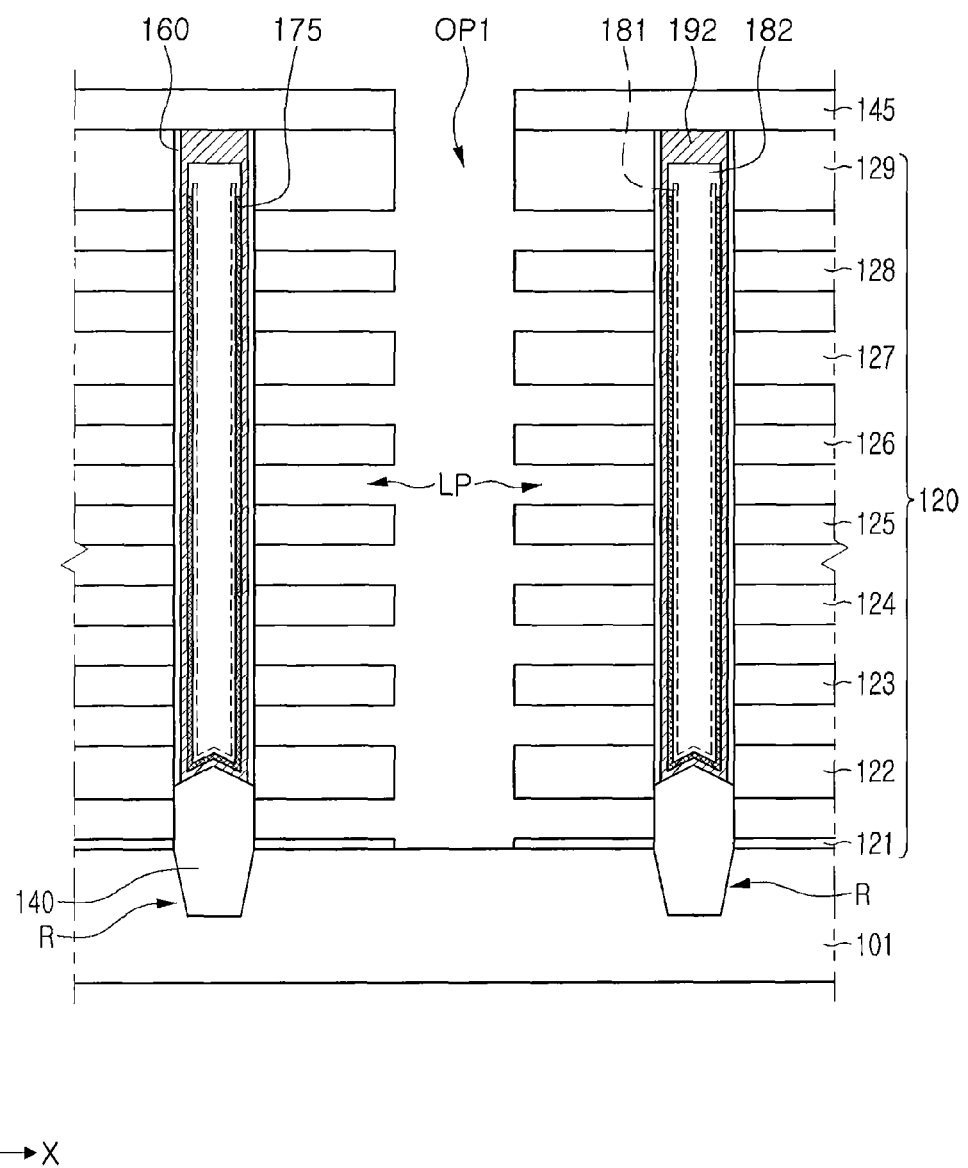

Referring to FIG. 22, portions of the sacrificial layers 110 exposed through the first opening OP1 may be removed using an etching process.

A plurality of side openings LP defined between the interlayer insulating layers 120 may be formed in the sacrificial layer removal process described above. Portions of sidewalls of the gate dielectric layer 160 and the epitaxial layer 140 may be exposed through the side openings LP.

Figure 23:
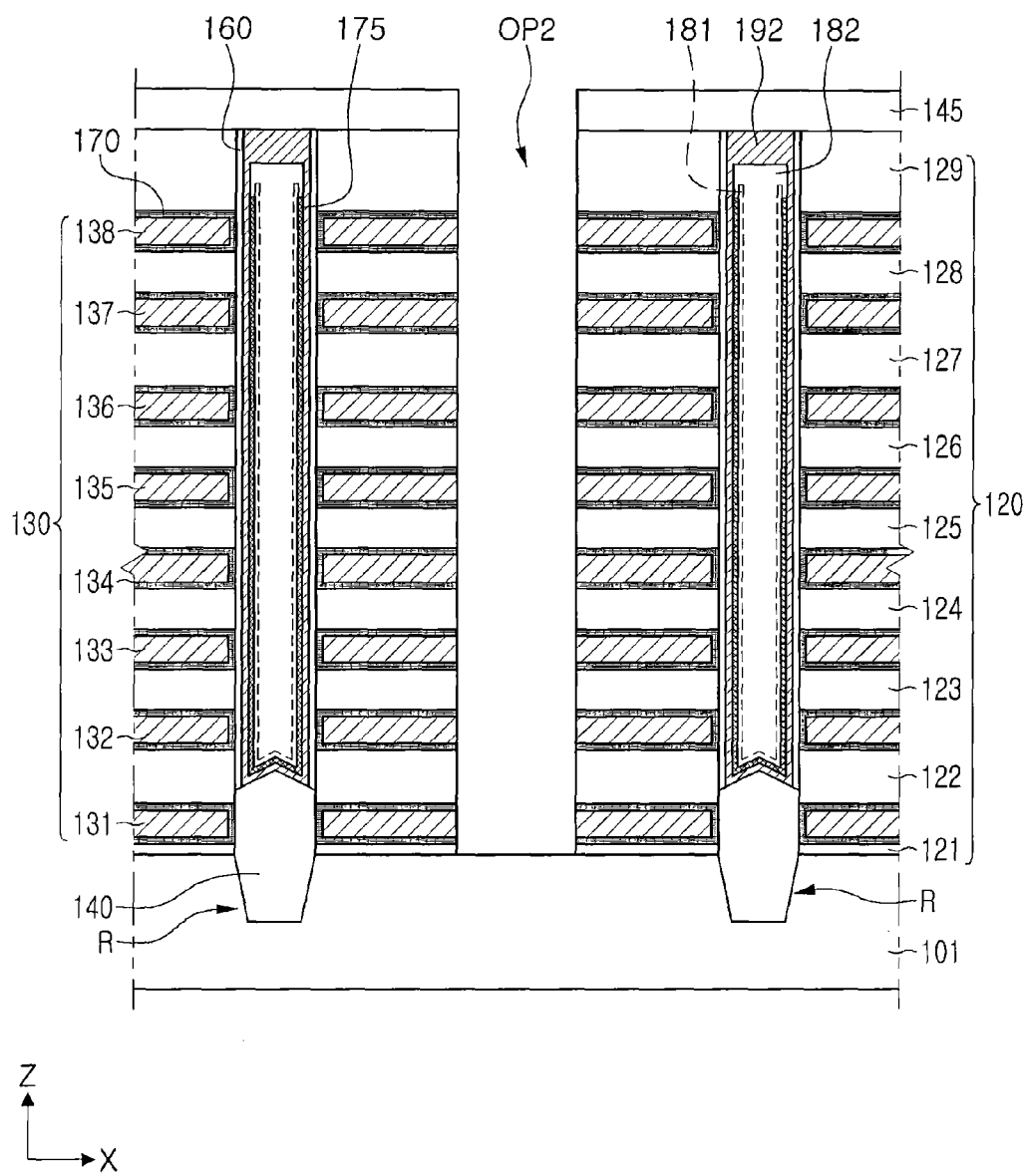

With reference to FIG. 23, diffusion barrier layers 170 and gate electrodes 130 may be formed in the side openings LP.

First, the diffusion barrier layers 170 may be formed to cover the gate dielectric layer 160, the interlayer insulating layers 120, and the substrate 101 exposed through the first opening OP1 and the side openings LP, and the side openings LP may be filled with the gate electrodes 130. Although the diffusion barrier layers 170 are illustrated as being discernible from the gate electrodes 130, in consideration of a different material layer from the gate electrodes 130 while being formed of a conductive material, the diffusion barrier layers 170 may also be understood to be a portion of the gate electrodes 130. In another example embodiment, the diffusion barrier layers 170 may be omitted. The gate electrodes 130 may include a metal, polycrystalline silicon, or a metal silicide material. The diffusion barrier layers 170 may include tungsten nitride (WN), tantalum nitride (TaN) and titanium nitride (TiN), or a combination thereof.

Next, a material forming the diffusion barrier layers 170 and the gate electrodes 130 formed within the first opening OP1 may be removed through an additional process, in such a manner that the diffusion barrier layers 170 and the gate electrodes 130 may only be disposed in the side openings LP, thereby forming a second opening OP2.

Figure 24:
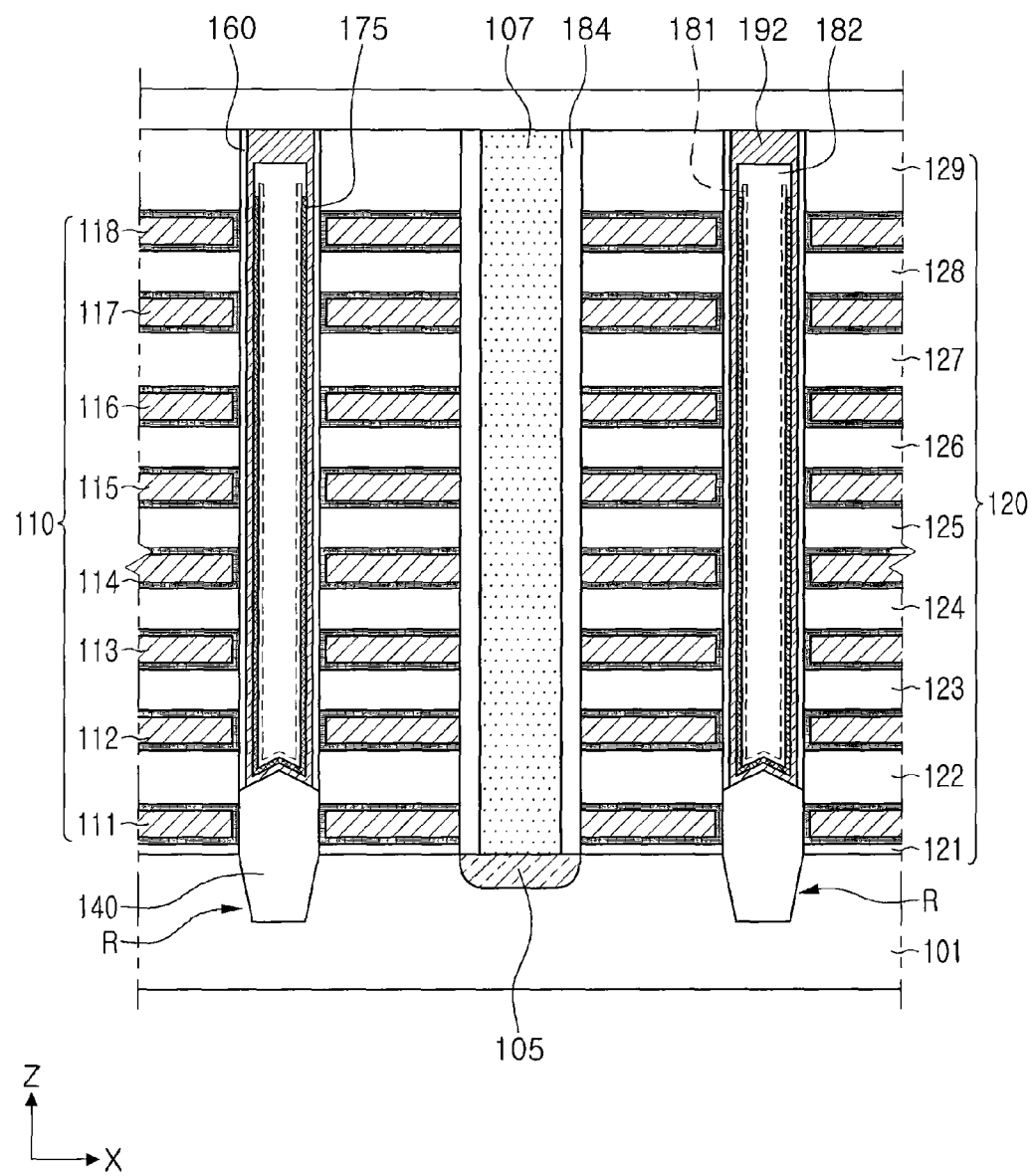

Referring to FIG. 24, an impurity region 105 may be formed in the substrate 101 within the second opening OP2, and a conductive layer 107 and a second insulating layer 184 may be formed on the impurity region 105.

The impurity region 105 may be formed by implanting an impurity into the substrate 101 exposed to the second opening OP2, and the second insulating layer 184 and the conductive layer 107 may be sequentially formed on a sidewall of the second opening OP2. In another example embodiment, the impurity region 105 may also be formed after forming the second insulating layer 184. The impurity region 105 may also be configured to include regions having different impurity concentrations. Next, a contact plug 194 connected to the conductive pad 192 may further be formed, and a bit line 195 connected to the contact plug 194 may be formed (see FIG 2). The bit line may be extended while connecting the conductive pads 192 arranged in an X direction to each other.

Figure 25:
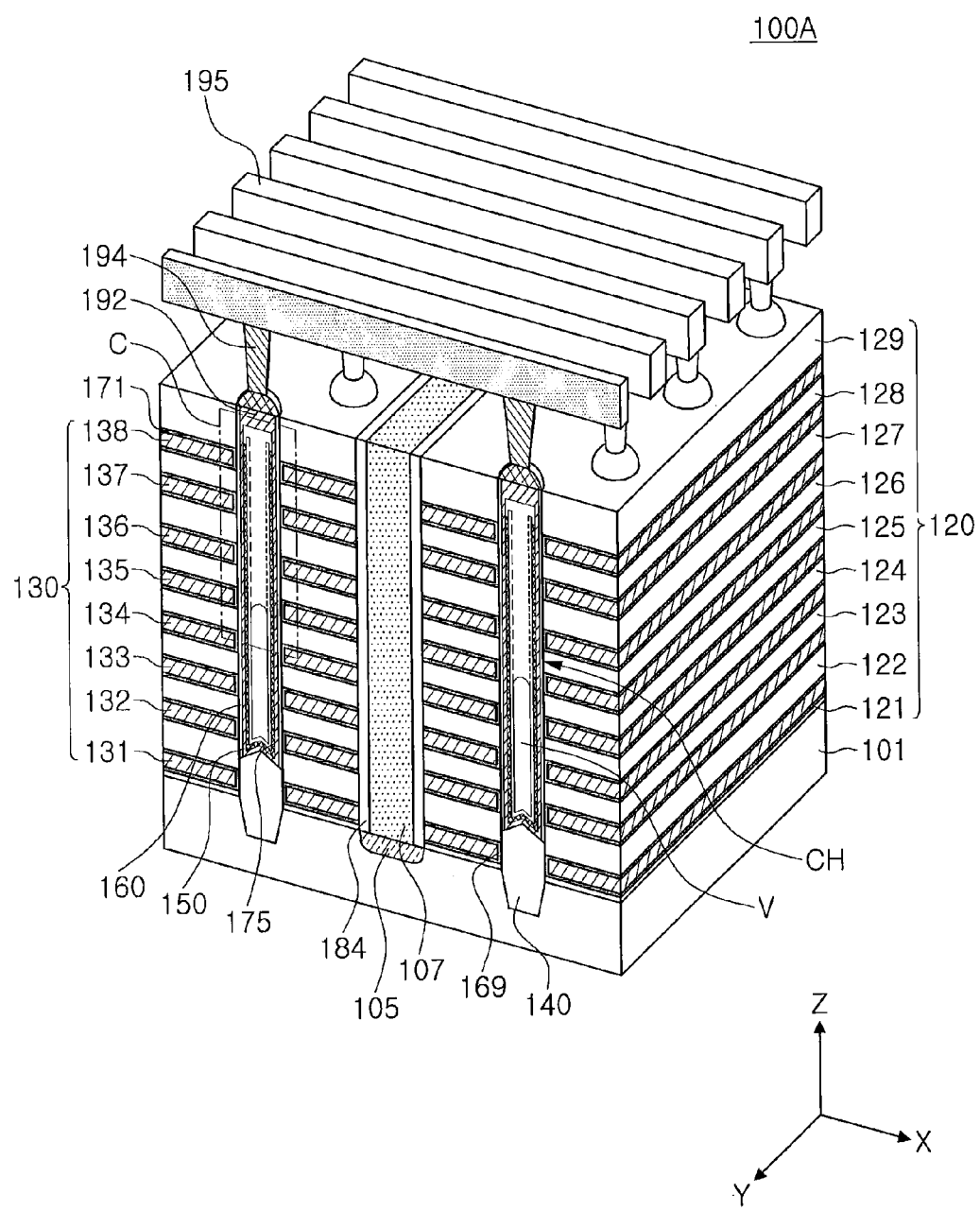
FIG. 25 is a schematic perspective view of a semiconductor device according to some embodiments of the inventive concepts.
Figure 26:
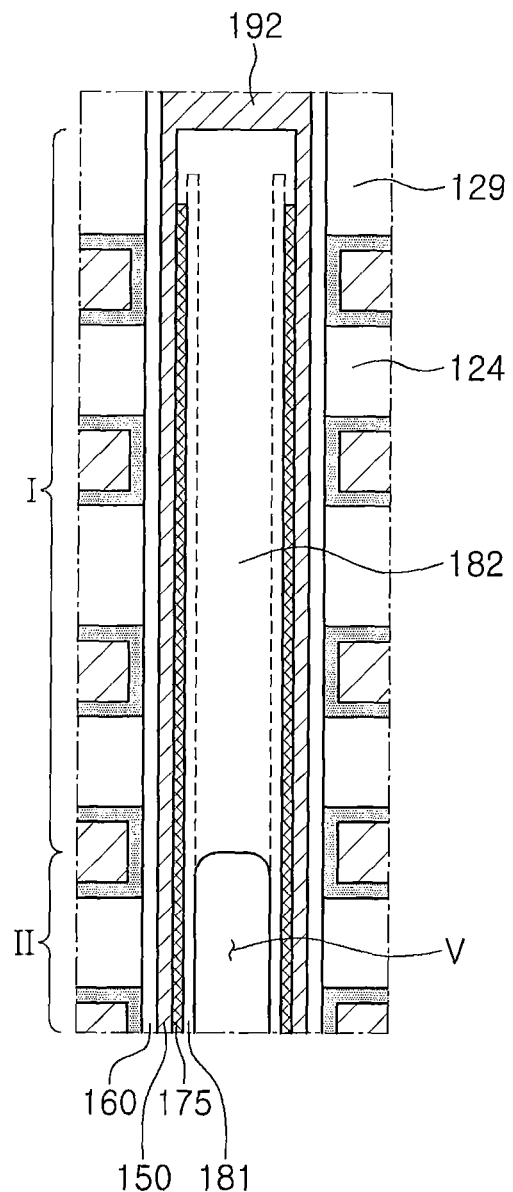
FIG. 26 is an enlarged cross-sectional view of region "C" of the semiconductor device illustrated in FIG. 25 according to some embodiments of the inventive concepts.

FIG. 25 is a schematic perspective view of a semiconductor device according to some embodiments of the inventive concepts. FIG. 26 is an enlarged cross-sectional view of region "C" of the semiconductor device illustrated in FIG. 25 according to some embodiments of the inventive concepts.

A semiconductor device 100A illustrated in FIG. 25 may be similar to the semiconductor device 100 illustrated in FIG. 2, except for the differences described below. For example, the semiconductor device 100A may contain a vacant space V in the interior of a channel layer. Reference numerals the same as or similar to those described in the foregoing embodiments represent the same or similar elements, and descriptions thereof may be omitted or briefly described in the following description in order to simplify the description.

Referring to FIGS. 25 and 26, a first insulating layer 182 may only fill a portion of the interior of a channel layer 150. In detail, the first insulating layer 182 may be provided in a portion of the interior of the channel layer 150, for example, an upper region I, adjacent to the conductive pad 192, and the vacant space V may be present in a lower region II of the interior of the channel layer 150.

In some embodiments, as illustrated in FIG. 26, it can be appreciated that in the lower region II of the channel layer 150 in which the vacant space V is present, a charge fixing layer 175 may be disposed on a surface of the channel layer 150 and an insulating film 181 may be disposed on the charge fixing layer 175. For example, when the insulating film 181 is formed of the same material as that of the first insulating layer 182, the insulating film 181 may be difficult to discern from the first insulating layer 182 in the upper region I formed by gap-filling, while in the lower region II in which the vacant space V is present, the insulating film 181 may be used as a mask on the charge fixing layer 175.

Figure 27:
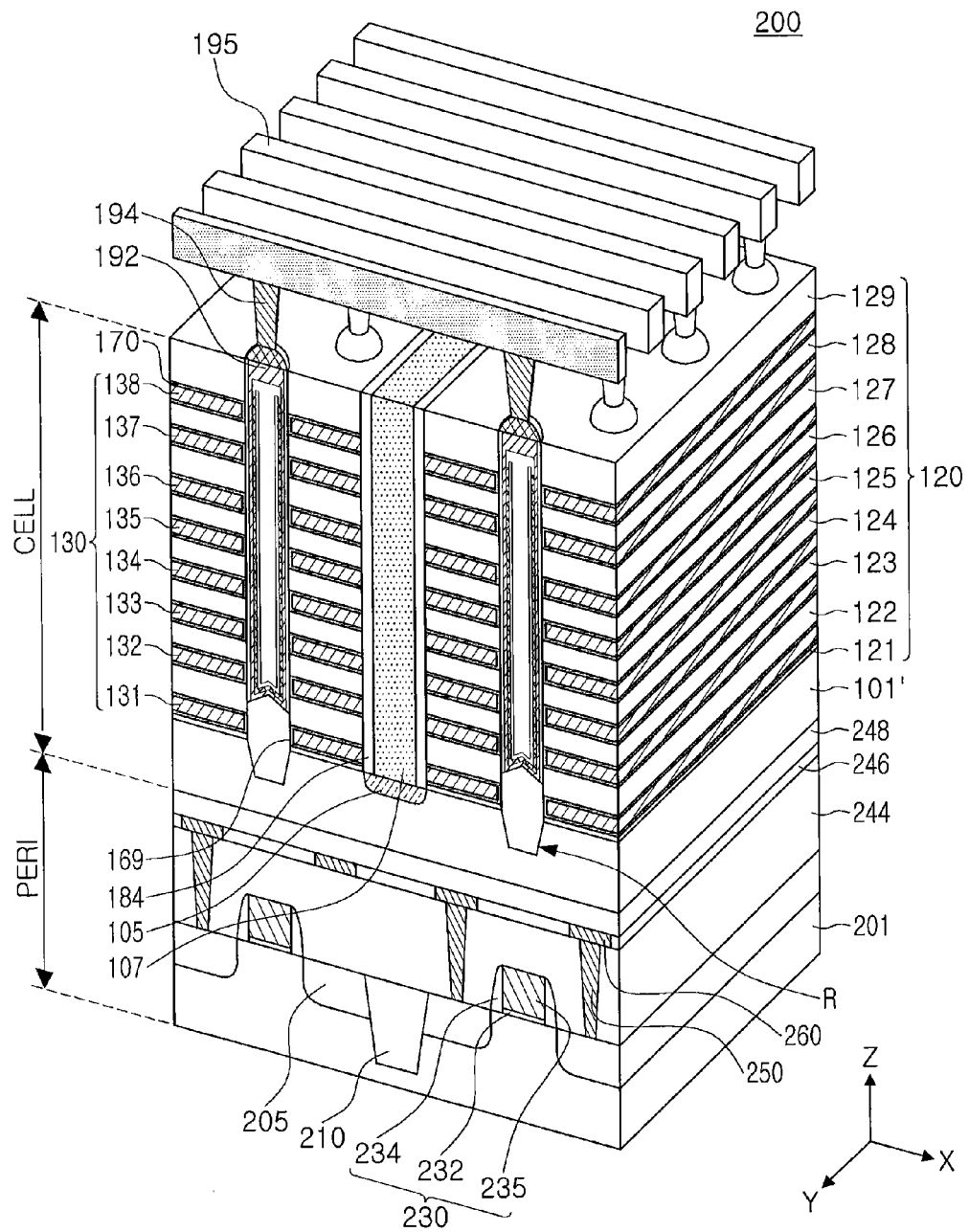
FIG. 27 is a schematic perspective view of a semiconductor device according to some embodiments of the inventive concepts.

FIG. 27 is a schematic perspective diagram of a semiconductor device according to some embodiments of the inventive concepts.

With reference to FIG. 27, a semiconductor device 200 may include a cell region CELL and a peripheral circuit region PERI. In this case, the cell region CELL may be disposed on the peripheral circuit region PERI.

The cell region CELL may include a plurality of channel layers 150 disposed in a direction perpendicular to an upper surface of a substrate 101', and a plurality of interlayer insulating layers 120 and a plurality of gate electrodes 130 stacked along outer sidewalls of the channel layers 150. Further, the cell region CELL may further include an epitaxial layer 140 disposed on the substrate 101' below the channel layer 150, a gate dielectric layer 160 disposed between the channel layer 150 and the gate electrodes 130, a conductive layer 107 disposed on the impurity region 105, and a conductive pad 192 on the channel layer 150.

In some embodiments, the cell region CELL may be understood to have a structure similar to the structure illustrated in FIG. 2, and a description thereof may refer to the description above with reference to FIG. 2. The cell region CELL is not limited to the structure of FIG. 2, but may have various structures according to other embodiments, for example, according to the embodiments of the inventive concepts illustrated in FIG. 25. Reference numerals the same as or similar to those described in the foregoing embodiments represent the same or similar elements, and descriptions thereof may be omitted or briefly described in the following description in order to simplify the description.

The peripheral circuit region PERI may include a base substrate 201, circuit elements 230 disposed on the base substrate 201, contact plugs 250, and wiring lines 260.

The base substrate 201 may have an upper surface extended in X and Y directions. In the base substrate 201, a device isolation layer 210 may be formed to define an active region. A doping region 205 including an impurity may be disposed in a portion of the active region. The base substrate 201 may include a semiconductor material, for example, a group IV semiconductor material, a group III-V compound semiconductor material, or a group II-VI compound semiconductor material. For example, an example of the group IV semiconductor material may include silicon, germanium, or silicon-germanium. The base substrate 201 may be provided as a bulk wafer or an epitaxial layer.

The circuit element 230 may include various types of field-effect transistors. Each of the circuit elements 230 may include a circuit gate insulating layer 232, a spacer layer 234, and a circuit gate electrode 235. On two sides of the circuit gate electrode 235, doping regions 205 may be disposed within the base substrate 201 to serve as a source region or a drain region of the circuit element 230.

A plurality of peripheral-region insulating layers 244, 246 and 248 may be disposed on the circuit elements 230, above the base substrate 201. The peripheral-region insulating layer 244 may include a high density plasma (HDP) oxide film to effectively fill a space between the plurality of circuit elements 230.

The contact plugs 250 may penetrate through the peripheral-region insulating layer 244 to be connected to the doping region 205. An electrical signal may be applied to the circuit elements 230 via the contact plugs 250. The contact plugs 250 may also be connected to the circuit gate electrodes 235 in a region not illustrated in the drawing. The wiring lines 260 may be connected to the contact plugs 250, and may be configured of a plurality of layers in some embodiments of the inventive concepts.

After the peripheral circuit region PERI is manufactured, the substrate 101' of the cell region CELL may be formed thereon, thereby forming the cell region CELL. The substrate 101' may have the same size as that of the base substrate 201, or may be formed to have a size less than that of the base substrate 201. The substrate 101' may be formed of crystalline silicon, or may be crystallized after being formed of amorphous silicon.

The cell region CELL may be electrically connected to the peripheral circuit region PERI. For example, one end of the gate electrode 130 in a Y direction may be electrically connected to the circuit element 230.

In the case of the semiconductor device 200 according to some embodiments, since the cell region CELL and the peripheral circuit region PERI are disposed in a vertical direction, a miniaturized device may be implemented.

Figure 28:
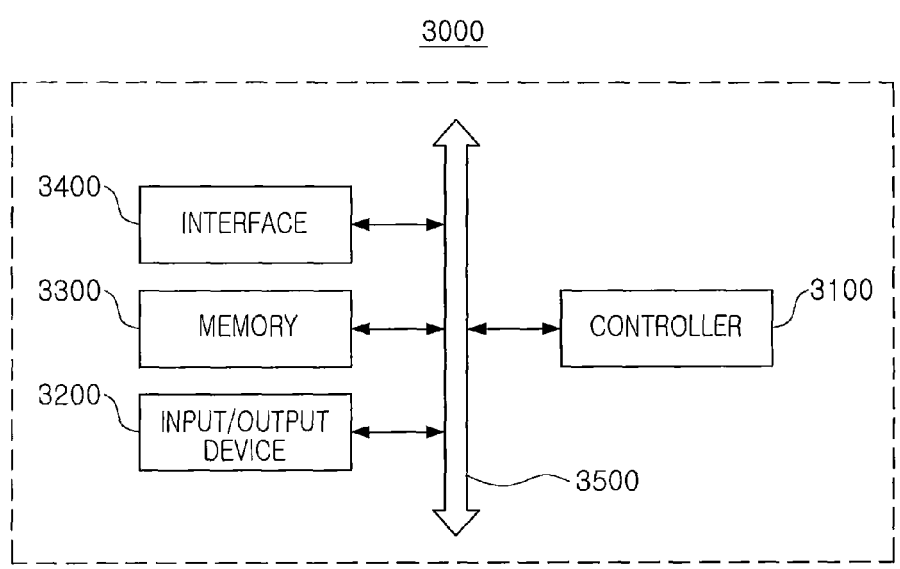
FIG. 28 is a block diagram of an electronic apparatus including a semiconductor device according to some embodiments of the inventive concepts.

FIG. 28 is a block diagram of an electronic apparatus including a semiconductor device according to some embodiments of the inventive concepts.

With reference to FIG. 28, an electronic system 3000 may include a controller 3100, an input/output device 3200, a memory 3300, and an interface 3400. The electronic system 3000 may be a mobile system or a system transmitting or receiving information. The mobile system may be a personal digital assistant (PDA), a portable computer, a web tablet, a wireless phone, a mobile phone, a digital music player, or a memory card.

The controller 3100 may execute a program and may serve to control the electronic system 3000. For example, the controller 3100 may be a microprocessor, a digital signal processor, a microcontroller, or a device similar thereto.

The input/output device 3200 may be used to input or output data of the electronic system 3000. The electronic system 3000 may be connected to an external device, for example, a personal computer or a network to exchange data therebetween using the input/output device 3200. The input/output device 3200 may be, for example, a keypad, a keyboard, or a display.

The memory 3300 may store a code and/or data for operations of the controller 3100 therein, and/or may store data processed by the controller 3100 therein. The memory 3300 may include a semiconductor device according to various example embodiments as described above.

The interface 3400 may serve as a data transmission path between the electronic system 3000 and an external different device. The controller 3100, the input/output device 3200, the memory 3300, and the interface 3400 may communicate with one another via a bus 3500.

As set forth above, according to example embodiments, a charge fixing layer may be employed adjacently to a channel layer, thereby reducing an effective thickness of the channel layer in terms of electrical aspects. Channel characteristics such as swing and current characteristics may be improved. A defect, such as disconnection of a channel layer, due to an excessive degree of reduction in a physical thickness of the channel layer may be prevented.

While example embodiments have been shown and described above, it will be apparent to those skilled in the art that modifications and variations could be made without departing from the scope of the present inventive concept as defined by the appended claims.

What is claimed is:
1. A semiconductor device comprising:
   gate electrodes and interlayer insulating layers alternately stacked on a substrate;
   a channel layer penetrating the gate electrodes and the interlayer insulating layers;
   a gate dielectric layer between the gate electrodes and the channel layer;
   a filling insulation that fills at least a portion of an interior of the channel layer;
   a charge fixing layer between the channel layer and the filling insulation and including a high-k material and/or a metal; and
   a conductive pad connected to the channel layer and on the filling insulation, the conductive pad being physically separated from the charge fixing layer.

2. The semiconductor device of claim 1, wherein the charge fixing layer has an upper end positioned further from the substrate than an upper surface of an uppermost gate electrode among the gate electrodes.

3. The semiconductor device of claim 2, wherein a distance between the upper end of the charge fixing layer and the upper surface of the uppermost gate electrode is 100 Å or more.

4. The semiconductor device of claim 1, wherein the charge fixing layer extends continuously on a surface of the channel layer along regions thereof corresponding to the gate electrodes.

5. The semiconductor device of claim 1,
   wherein the filling insulation fills a portion of the interior of the channel layer, adjacent to the conductive pad, and
   wherein the interior of the channel layer further comprises a lower region that comprises a vacant space that is free of the filling insulation.

6. The semiconductor device of claim 5, further comprising an insulating film on the charge fixing layer in the lower region of the interior of the channel layer.

7. The semiconductor device of claim 1, further comprising an insulating film on a surface of the charge fixing layer opposite from the channel layer.

8. The semiconductor device of claim 1, wherein the charge fixing layer comprises aluminum oxide ($Al_2O_3$), hafnium oxide ($HfO_2$), lanthanum oxide ($La_2O_3$), lanthanum aluminum oxide ($LaAl_xO_y$), lanthanum hafnium oxide ($LaHf_xO_y$), and/or hafnium aluminum oxide ($HfAl_xO_y$).

9. The semiconductor device of claim 1, wherein the charge fixing layer comprises aluminum, hafnium, and/or lanthanum.

10. The semiconductor device of claim 1, further comprising an epitaxial layer between the substrate and the channel layer, the epitaxial layer contacting the channel layer and contacting the substrate.

11. A semiconductor device comprising:
a stacked structure including conductive layers and interlayer insulating layers alternately stacked on a substrate, and having a hole penetrating through the stacked structure in a stacking direction;
a vertical structure in the hole, the vertical structure sequentially comprising a gate dielectric layer, a channel layer and a charge fixing layer adjacent to the conductive layers; and
a conductive pad on the vertical structure and connected to the channel layer,
wherein the charge fixing layer comprising a material configured to allow negative charges to be accumulated therein, and
wherein the charge fixing layer is physically separated from the conductive pad.

12. The semiconductor device of claim 11, wherein the charge fixing layer comprises aluminum oxide ($Al_2O_3$), hafnium oxide ($HfO_2$), lanthanum oxide ($La_2O_3$), lanthanum aluminum oxide ($LaAl_xO_y$), lanthanum hafnium oxide ($LaHf_xO_y$), and/or hafnium aluminum oxide ($HfAl_xO_y$).

13. The semiconductor device of claim 11, further comprising a filling insulation that fills at least a portion of an interior of the channel layer,
wherein the charge fixing layer and the conductive pad are separated from each other by the filling insulation.

14. The semiconductor device of claim 13, wherein the channel layer comprises a vacant space in a lower region of the channel layer adjacent to the substrate,
the semiconductor device further comprising an insulating film on the charge fixing layer in the lower region of the channel layer.

15. The semiconductor device of claim 14, wherein the insulating film comprises a material substantially identical to a material of the filling insulation.

16. A semiconductor device comprising:
a plurality of gate electrodes and a plurality of interlayer insulating layers alternately stacked on a substrate;
a channel layer penetrating the plurality of gate electrodes and the plurality of interlayer insulating layers, the channel layer comprising an exterior surface adjacent to the plurality of gate electrodes and an interior surface remote from the plurality of gate electrodes;
a charge fixing layer on the interior surface of the channel layer, the charge fixing layer being configured to reduce an effective width of the channel layer during an operation of the semiconductor device to less than a physical width of the channel layer by accumulating negative charges; and
a conductive pad connected to the channel layer, the conductive pad being physically separated from the charge fixing layer.

17. The semiconductor device of claim 16, wherein the conductive pad is physically separated from the charge fixing layer by an insulating layer.

18. The semiconductor device of claim 16,
wherein the charge fixing layer comprises an upper end that is remote from the substrate,
wherein the plurality of gate electrodes comprises an uppermost gate electrode that is most remote from the substrate among the plurality of gate electrodes,
wherein the uppermost gate electrode comprises an upper surface remote from the substrate, and
wherein the charge fixing layer extends away from the substrate beyond the upper surface of the uppermost gate electrode.

19. The semiconductor device of claim 18, wherein a distance between the upper end of the charge fixing layer and the upper surface of the uppermost gate electrode is at least 100 Å, and
wherein the charge fixing layer comprises a uniform thickness over the interior surface of the channel layer.

20. The semiconductor device of claim 16,
wherein the charge fixing layer comprises aluminum oxide ($Al_2O_3$), hafnium oxide ($HfO_2$), lanthanum oxide ($La_2O_3$), lanthanum aluminum oxide ($LaAl_xO_y$), lanthanum hafnium oxide ($LaHf_xO_y$), and/or hafnium aluminum oxide ($HfAl_xO_y$), and
wherein the channel layer comprises a semiconductor material.

* * * * *